US009525400B2

(12) United States Patent  (10) Patent No.: US 9,525,400 B2
Obata  (45) Date of Patent: Dec. 20, 2016

(54) RESONATOR ELEMENT, RESONATOR, OSCILLATOR, ELECTRONIC APPARATUS AND MOVING OBJECT

(71) Applicant: Seiko Epson Corporation, Tokyo (JP)

(72) Inventor: Naohisa Obata, Minowa (JP)

(73) Assignee: Seiko Epson Corporation (JP)

( * ) Notice: Subject to any disclaimer, the term of this patent is extended or adjusted under 35 U.S.C. 154(b) by 298 days.

(21) Appl. No.: 14/155,462

(22) Filed: Jan. 15, 2014

(65) Prior Publication Data

US 2014/0203689 A1  Jul. 24, 2014

(30) Foreign Application Priority Data

Jan. 18, 2013 (JP) .................................. 2013-007912

(51) Int. Cl.
| | | |
|---|---|---|
| *H01L 41/053* | (2006.01) | |
| *H03H 9/19* | (2006.01) | |
| *H03H 9/10* | (2006.01) | |

(52) U.S. Cl.
CPC ............. *H03H 9/19* (2013.01); *H03H 9/1021* (2013.01)

(58) Field of Classification Search
CPC ......... H01L 41/0926; H03H 9/24; H03H 9/17; H03H 9/0595; H03H 9/15; H03H 9/19
USPC .......................... 310/321, 348, 361, 365, 367
See application file for complete search history.

(56) References Cited

U.S. PATENT DOCUMENTS

| | | | |
|---|---|---|---|
| 6,791,243 B2* | 9/2004 | Kawashima | ......... H03H 9/1021 310/319 |
| 7,098,574 B2 | 8/2006 | Iwata | |
| 8,026,652 B2 | 9/2011 | Yasuike | |
| 2007/0096596 A1* | 5/2007 | Naito | ....................... H03H 3/04 310/320 |
| 2009/0167117 A1* | 7/2009 | Yasuike | ................... H03H 3/04 310/361 |
| 2012/0306321 A1* | 12/2012 | Ishii | ..................... H03H 9/0542 310/348 |
| 2013/0043959 A1* | 2/2013 | Ishii | ..................... H03H 9/0542 331/158 |
| 2013/0043960 A1 | 2/2013 | Ishii et al. | |

FOREIGN PATENT DOCUMENTS

| | | |
|---|---|---|
| JP | 2001-144578 A | 5/2001 |
| JP | 2002-033640 A | 1/2002 |
| JP | 2002-198772 A | 7/2002 |
| JP | 2003-264446 A | 9/2003 |
| JP | 2004-165743 A | 6/2004 |
| JP | 2006-203700 A | 8/2006 |
| JP | 2009-164824 A | 7/2009 |

(Continued)

*Primary Examiner* — Shawki S Ismail
*Assistant Examiner* — Bryan Gordon
(74) *Attorney, Agent, or Firm* — Harness, Dickey & Pierce, P.L.C.

(57) ABSTRACT

A resonator element has a piezoelectric substrate including a vibration section and a thick section having a thickness which is thicker than that of the vibration section, and a pair of excitation electrodes provided on a surface and a back surface of the vibration section. In addition, the thick section has a second thick section provided along a second outer edge of the vibration section. The second thick section has an outer edge section intersecting with both axes of an X axis and a Z' axis in an end portion opposite to the fixing section in a plan view of the resonator element.

16 Claims, 24 Drawing Sheets

(56) References Cited

FOREIGN PATENT DOCUMENTS

| JP | 2012-253630 A | 12/2012 |
|----|---------------|---------|
| JP | 2013-042410 A | 2/2013  |
| JP | 2013-042440 A | 2/2013  |
| JP | 2013-046189 A | 3/2013  |

\* cited by examiner

RESONATOR ELEMENT, RESONATOR, OSCILLATOR, ELECTRONIC APPARATUS AND MOVING OBJECT

BACKGROUND

1. Technical Field

The present invention relates to a resonator element, a resonator, an oscillator, an electronic apparatus and a moving object.

2. Related Art

An AT cut quartz crystal resonator element is used in various fields such as a piezoelectric oscillator and an electronic apparatus because a vibration mode of a main vibration to be excited of the AT cut quartz crystal resonator element is a thickness-shear vibration and the AT cut quartz crystal resonator element presents a cubic curve that is suitable for reduction of the size and high frequency, and is excellent in frequency-temperature characteristics.

An AT cut quartz crystal resonator element of a reverse mesa structure having a thin vibration section and a thick section provided in an entire circumference of the vibration section is disclosed in JP-A-2002-198772. The AT cut quartz crystal resonator element is fixed to a package through adhesive in one end portion of the thick section. If acceleration is applied to the AT cut quartz crystal resonator element in a thickness direction in a state where the AT cut quartz crystal resonator element is cantilevered, there is a problem that the vibration section that is on a side of a free end thereof is vibrated (deformed) and vibration characteristics (frequency characteristics) are not stable. Particularly, in the AT cut quartz crystal resonator element disclosed in JP-A-2002-198772, since a weight of a leading end portion is heavy due to the formation of the thick section in the entire circumference of the vibration section, an effect on the acceleration increases and an amount of deviation of the frequency also increases correspondingly.

SUMMARY

An advantage of some aspects of the invention is that it provides a resonator element which can reduce change in vibration characteristics due to an external force such as acceleration (vibration) and can exhibit stable vibration characteristics, a resonator, an oscillator, an electronic apparatus and a moving object.

The invention can be implemented as the following application examples.

Application Example 1

A resonator element according to this application example includes: a substrate that includes a first region having a vibration region which is vibrated in thickness-shear vibration and a second region integrally formed with the first region, and which has a thickness which is thicker than that of the first region; and excitation electrodes that are respectively provided in a first main surface and a second main surface of the vibration region, which have a front and back relationship with each other. The second region includes: a first thick section in which a fixing section to which an object is attached is disposed; and a second thick section that is connected to the first thick section. The second thick section includes: outer edge sections that intersect with respect to a vibration direction of the thickness-shear vibration and a direction orthogonal to the vibration direction of the thickness-shear vibration in an end portion opposite to the side of the fixing section in a plan view.

Accordingly, it is possible to obtain a resonator element in which a mass on the side of the leading end (a side opposite to the fixing section) is decreased, changes in vibration characteristics due to an external force such as acceleration (vibration) are decreased and stable vibration characteristics can be exhibited.

Application Example 2

In the resonator element according to the application example, it is preferable that the first region includes: a pair of first outer edges that intersect with the vibration direction of the thickness-shear vibration; and a pair of second outer edges that are along the vibration direction of the thickness-shear vibration, and the first thick section is provided along one of the pair of first outer edges, and the second thick section is provided along at least one of the pair of second outer edges.

With this configuration, it is possible to obtain a resonator element in which a mass on the side of the leading end (a side opposite to the fixing section) is decreased, changes in vibration characteristics due to an external force such as acceleration (vibration) are decreased and stable vibration characteristics can be exhibited.

Application Example 3

In the resonator element according to the application example, it is preferable that the second thick section includes: an inclination section that is connected to the second outer edge and of which a thickness gradually increases toward a direction leaving the second outer edge, and a thick section body having a constant thickness, which is connected to an edge of the inclination section opposite to the side of the second outer edge, and an entirety of the outer edge section is provided in the thick section body.

With this configuration, it is possible to decrease the mass on the side of the leading end while high rigidity of the resonator element is secured.

Application Example 4

In the resonator element according to the application example, it is preferable that the second thick section includes: an inclination section that is connected to the second outer edge and of which a thickness gradually increases in a direction leaving the second outer edge, and a thick section body having a constant thickness, which is connected to an edge of the inclination section opposite to the second outer edge, and the outer edge section is provided across the thick section body and the inclination section.

With this configuration, it is possible to decrease the mass on the side of the leading end while the rigidity of the resonator element is secured.

Application Example 5

In the resonator element according to the application example, it is preferable that the second thick section includes: an inclination section that is connected to the second outer edge and of which a thickness gradually increases in a direction leaving the second outer edge, and a thick section body having a constant thickness, which is connected to an edge of the inclination section opposite to the second outer edge, and the outer edge section is provided across the thick section body, the inclination section and the first region.

With this configuration, it is possible to further decrease the mass on the side of the leading end.

Application Example 6

In the resonator element according to the application example, it is preferable that in the vibration direction of the thickness-shear vibration of the second thick section, when a region aligned with the excitation electrode is a first thick region, and a region opposite to the fixing section from the first thick region is a second thick region, the outer edge section is provided across the second thick region and the first thick region.

With this configuration, it is possible to further decrease the mass on the side of the leading end while the rigidity of the resonator element is secured.

Application Example 7

In the resonator element according to the application example, it is preferable that in the vibration direction of the thickness-shear vibration of the second thick section, when a region aligned with the excitation electrode is a first thick region, a region opposite to the fixing section from the first thick region is a second thick region, and a region on the side of the fixing section from the first thick region is a third thick region, the outer edge section is provided across the second thick region, the first thick region and the third thick region.

With this configuration, it is possible to further decrease the mass on the side of the leading end.

Application Example 8

In the resonator element according to the application example, it is preferable that in a plan view of the substrate, when an area of a region is S1, which is surrounded by: an edge of the thick section body of the second thick section on the side of the second outer edge, an edge opposite to the second outer edge, a straight line intersecting with an end of the excitation electrode in the vibration direction and orthogonal to the vibration direction, and a straight line intersecting with the other end of the excitation electrode in the vibration direction and orthogonal to the vibration direction, and an area of the second thick section positioned in the region is S2, a relationship of $0.65 \leq S2/S1 \leq 0.85$ is satisfied.

With this configuration, it is possible to decrease the mass on the side of the leading end while the rigidity of the resonator element is secured.

Application Example 9

In the resonator element according to the application example, it is preferable that in a plan view of the substrate, when an area of a region is S3, which is surrounded by: an edge of the thick section body of the second thick section on the side of the second outer edge, an edge opposite to the second outer edge, a straight line intersecting with an end of the first region in the vibration direction and orthogonal to the vibration direction, and a straight line intersecting with the other end of the first region in the vibration direction and orthogonal to the vibration direction, and an area of the second thick section positioned in the region is S4, a relationship of $S4/S3 \leq 0.75$ is satisfied.

With this configuration, it is possible to sufficiently decrease the mass on the side of the end.

Application Example 10

In the resonator element according to the application example, it is preferable that in a plan view of the substrate, an area of the first region is ½ or less of an area of the substrate.

With this configuration, it is possible to sufficiently secure the rigidity of the resonator element.

Application Example 11

In the resonator element according to the application example, it is preferable that the first outer edge connected to the first thick section and the second outer edge connected to the second thick section are connected to each other by: a third outer edge intersecting with both directions of the vibration direction and a direction orthogonal to the vibration direction.

With this configuration, it is possible to relieve stress concentration on a boundary between the first outer edge connected to the first thick section and the second outer edge connected to the second thick section.

Application Example 12

In the resonator element according to the application example, it is preferable that the resonator element further includes: an extraction electrode that extends from the excitation electrode and is drawn to the main surface of the second region through a side wall connected to the second outer edge of the second region and a side wall connected to the third outer edge.

With this configuration, it is possible to widen the width of the extraction electrode and it is possible to reduce series resistance of the extraction electrode.

Application Example 13

In the resonator element according to the application example, it is preferable that a background on the side of the fixing section is capable of being visually recognized from the side of a surface opposite to the main surface of the substrate in which the fixing section is formed over the fixing section.

With this configuration, it is possible to accurately control the disposition and the diameter of the adhesive coming into contact with the fixing section or the like.

Application Example 14

In the resonator element according to the application example, it is preferable that the substrate is a quartz crystal substrate in which an X axis is a rotation axis, an axis inclined from a Z axis by rotating a plus Z side in a minus Y direction of a Y axis is a Z' axis, an axis inclined from the Y axis by rotating a plus Y side in a plus Z direction of the Z axis is a Y' axis, a surface including the X axis and the Z' axis is a main surface, and a direction along the Y' axis is a thickness thereof in the X axis as an electric axis, the Y axis as a mechanical axis, and the Z axis as an optical axis that are crystal axes of the quartz crystal.

With this configuration, it is possible to obtain a resonator element having excellent temperature characteristics.

Application Example 15

A resonator according to this application example includes: the resonator element according to the application example described above; and a package that stores the resonator element.

With this configuration, it is possible to obtain a resonator having high reliability.

Application Example 16

An oscillator according to this application example includes: the resonator element according to the application example described above; and an oscillation circuit driving the resonator element.

With this configuration, it is possible to obtain an oscillator having high reliability.

Application Example 17

An electronic apparatus according to this application example includes: the resonator element according to the application example described above.

With this configuration, it is possible to obtain an electronic apparatus having high reliability.

Application Example 18

A moving object according to this application example includes: the resonator element of the application example described above.

With this configuration, it is possible to obtain a moving object having high reliability.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
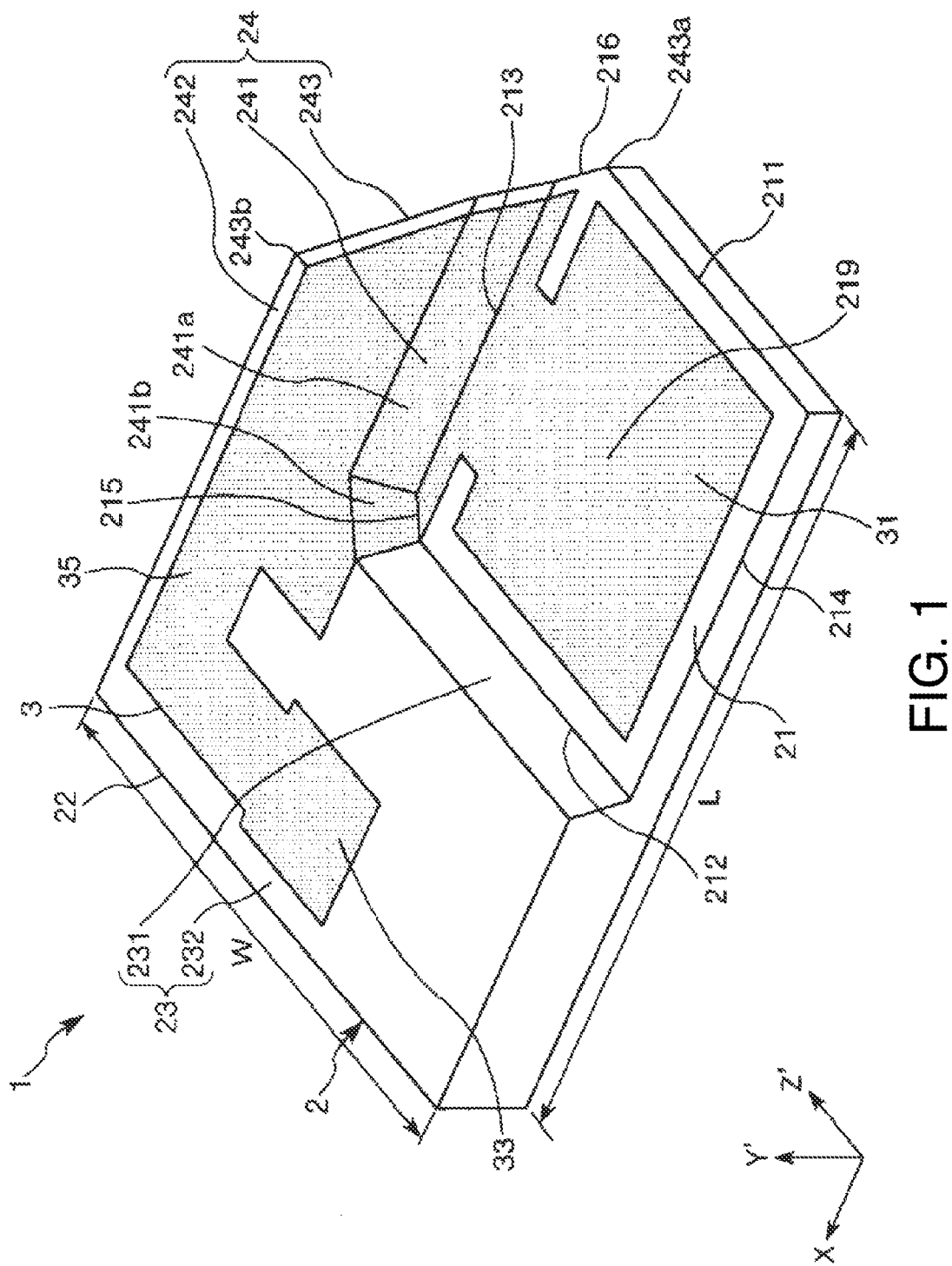
FIG. 1 is a perspective view of a resonator element according to a first embodiment of the invention.

Hereinafter, a resonator element, a resonator, an oscillator, an electronic apparatus and a moving object according to the invention will be described based on preferred embodiments illustrated in the drawings.

1. Resonator Element

First, the resonator element according to the invention is described.

First Embodiment

Figure 2:
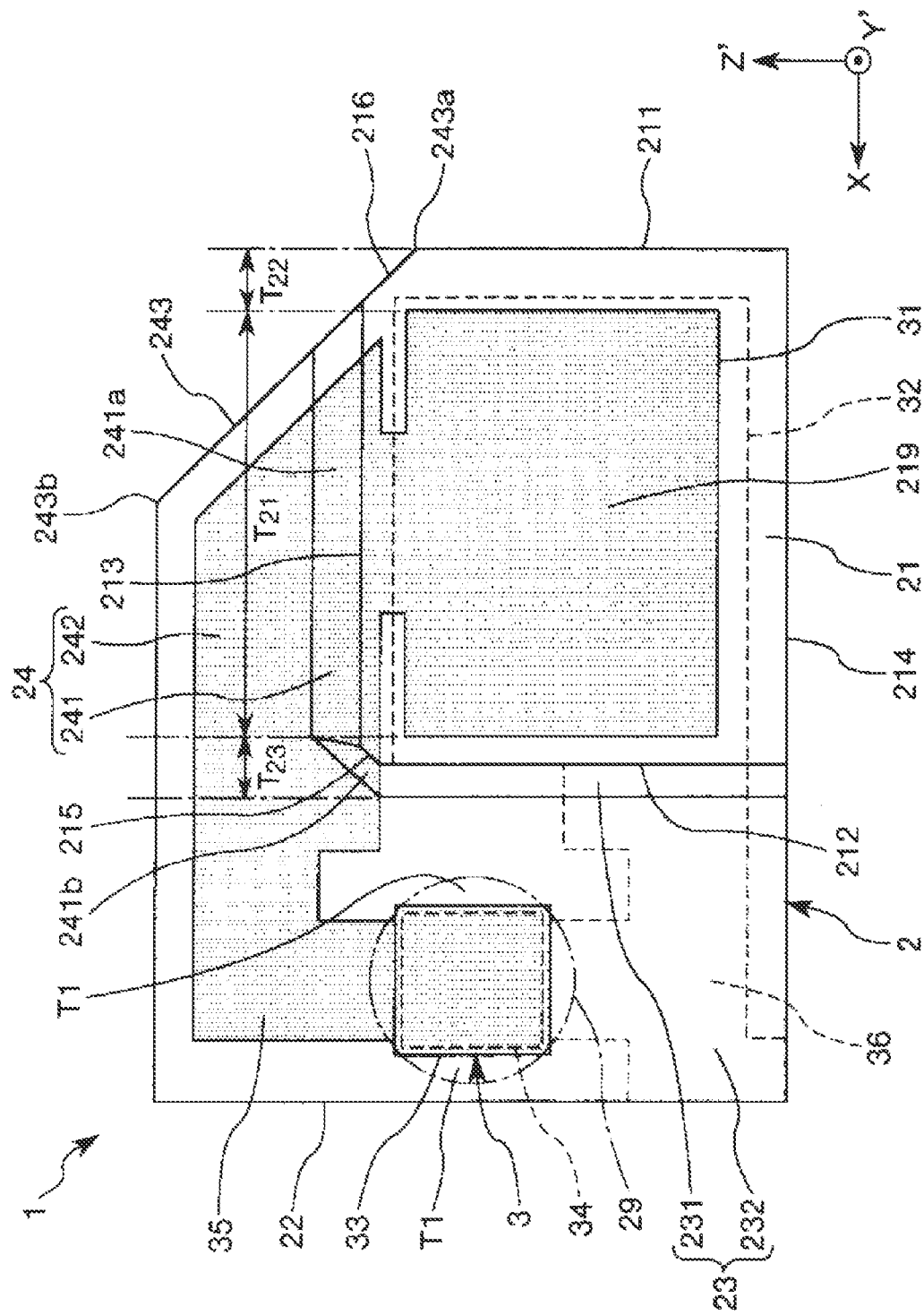
FIG. 2 is a plan view of the resonator element illustrated in FIG. 1.
Figure 3:
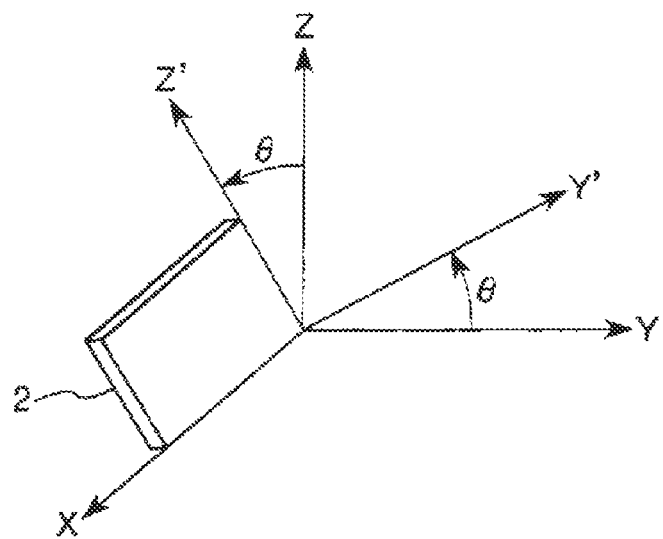
FIG. 3 is a view describing a relationship between an AT cut quartz crystal substrate and crystal axes of a quartz crystal.
Figure 4:
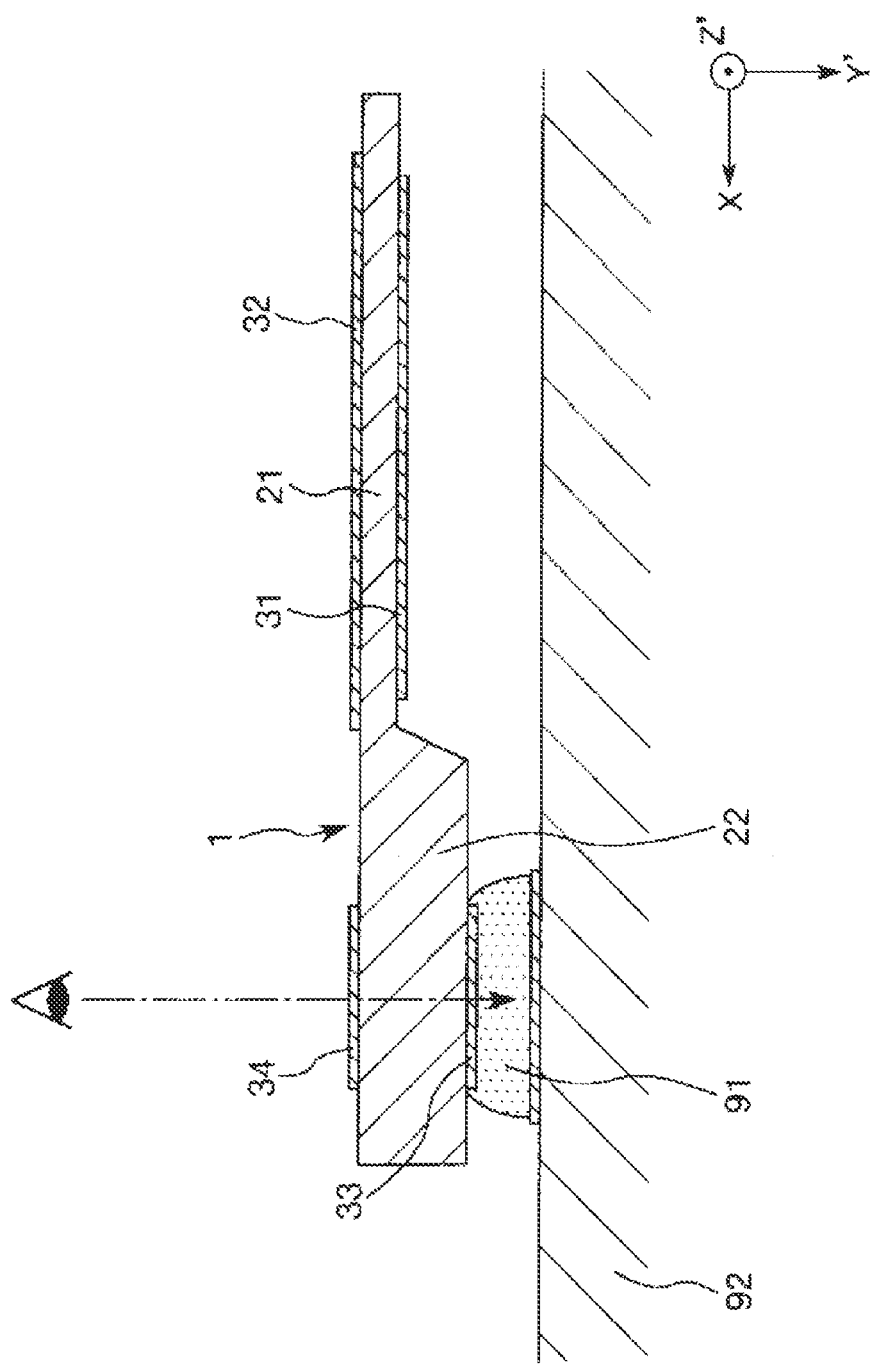
FIG. 4 is a side view illustrating a state where the resonator element illustrated in FIG. 1 is fixed to an object.
Figure 5:
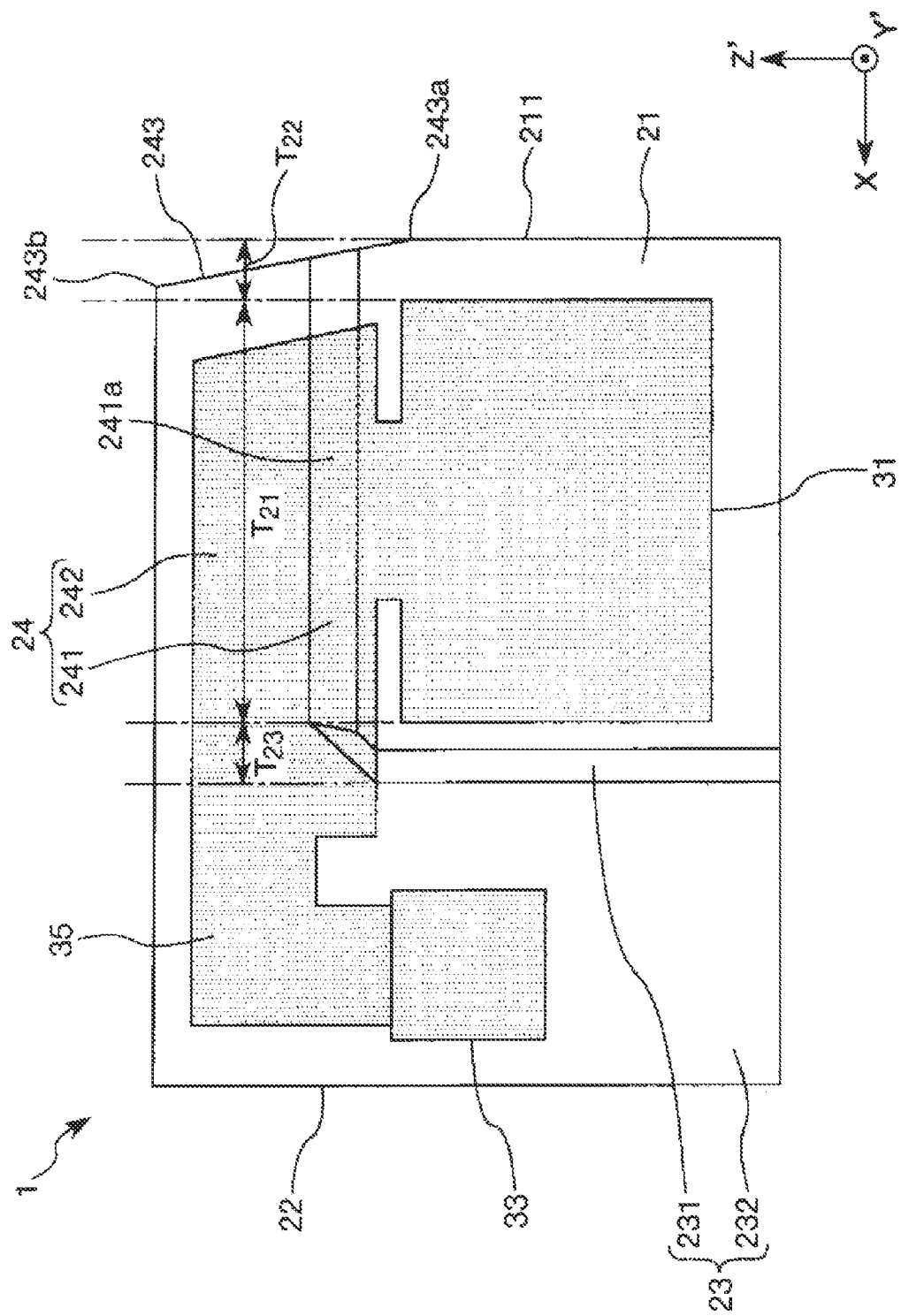
FIG. 5 is a plan view illustrating a modification example of the resonator element illustrated in FIG. 1.
Figure 6:
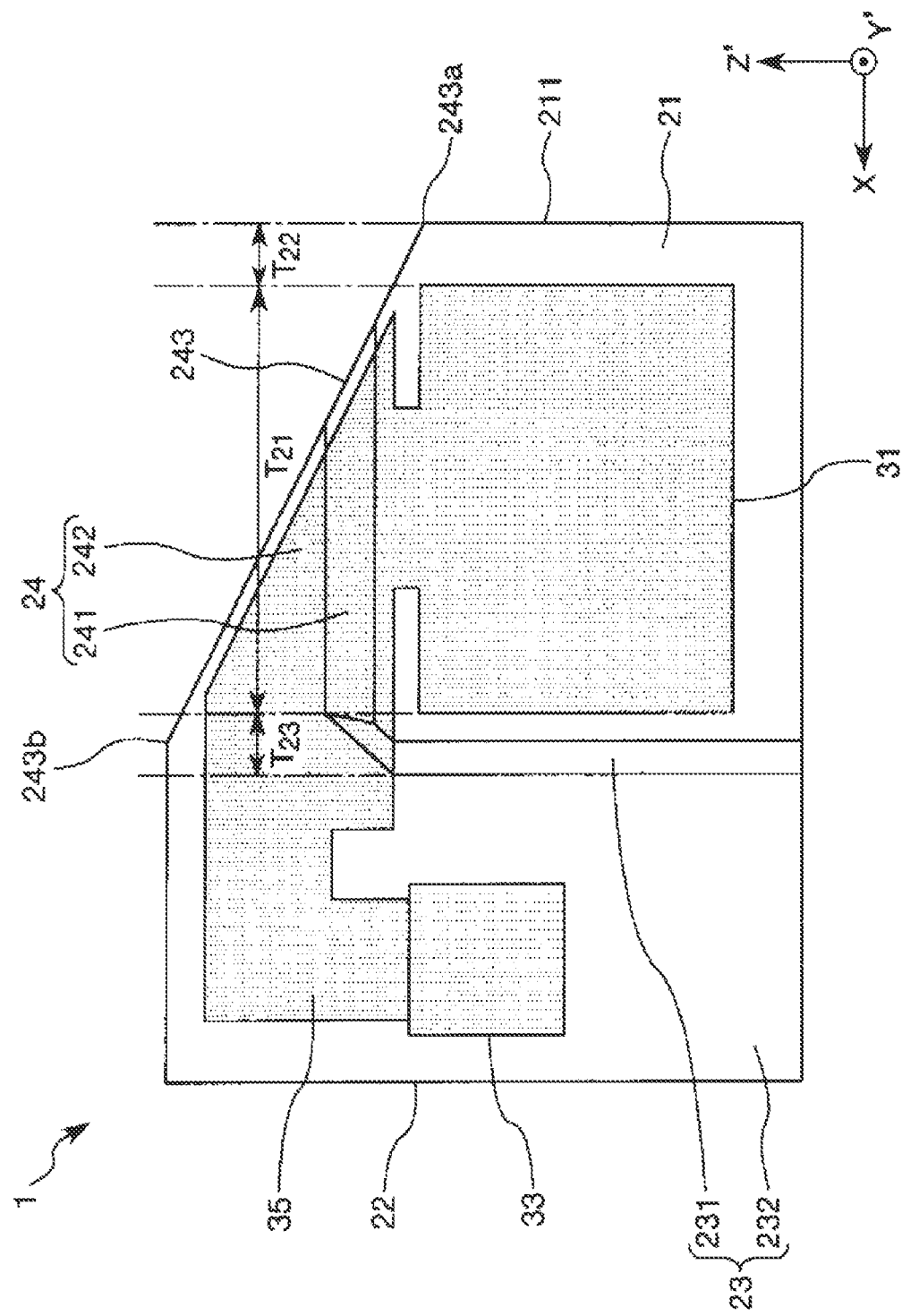
FIG. 6 is a plan view illustrating a modification example of the resonator element illustrated in FIG. 1.
Figure 7:
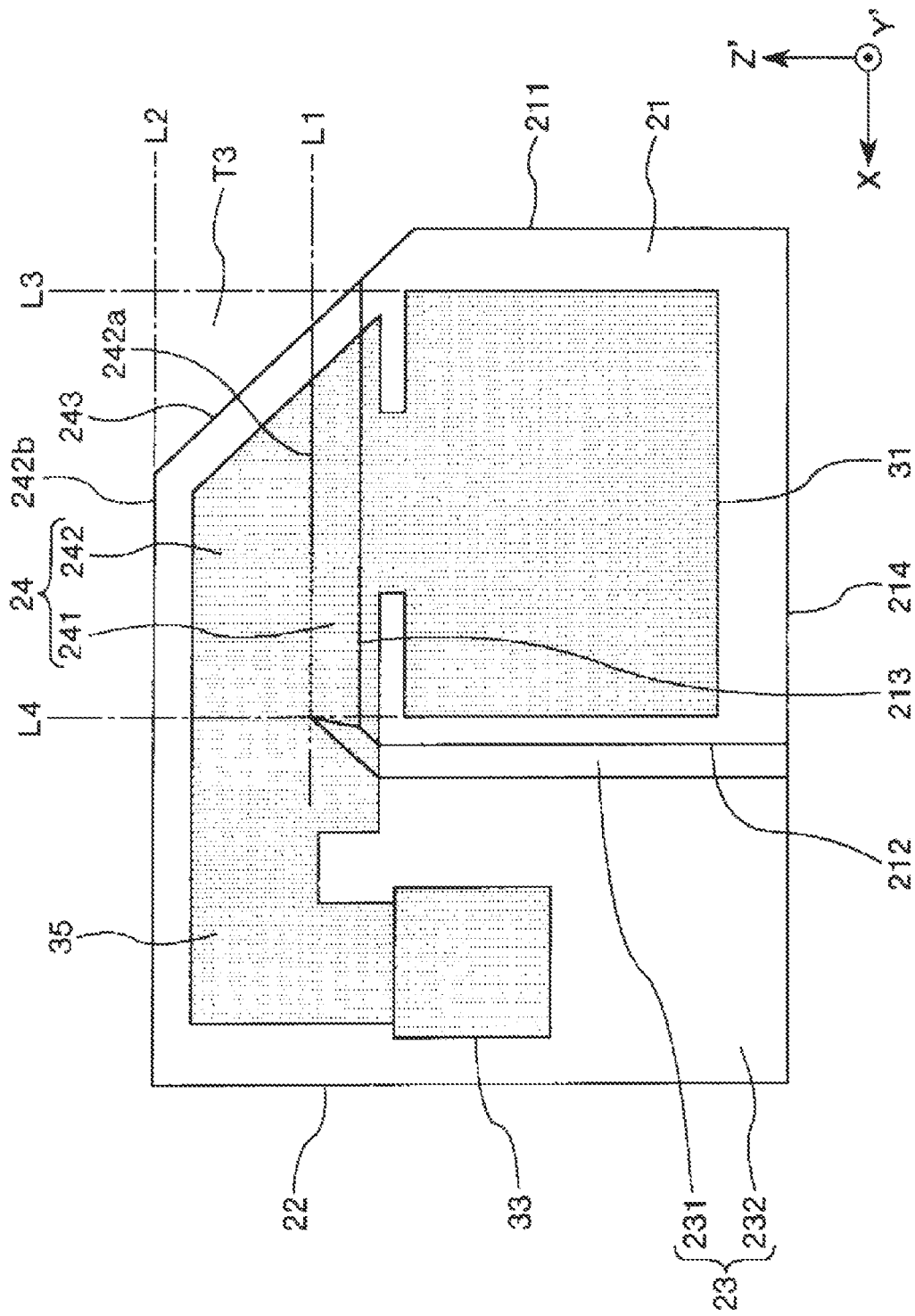
FIG. 7 is a plan view of the resonator element illustrated in FIG. 1.
Figure 8:
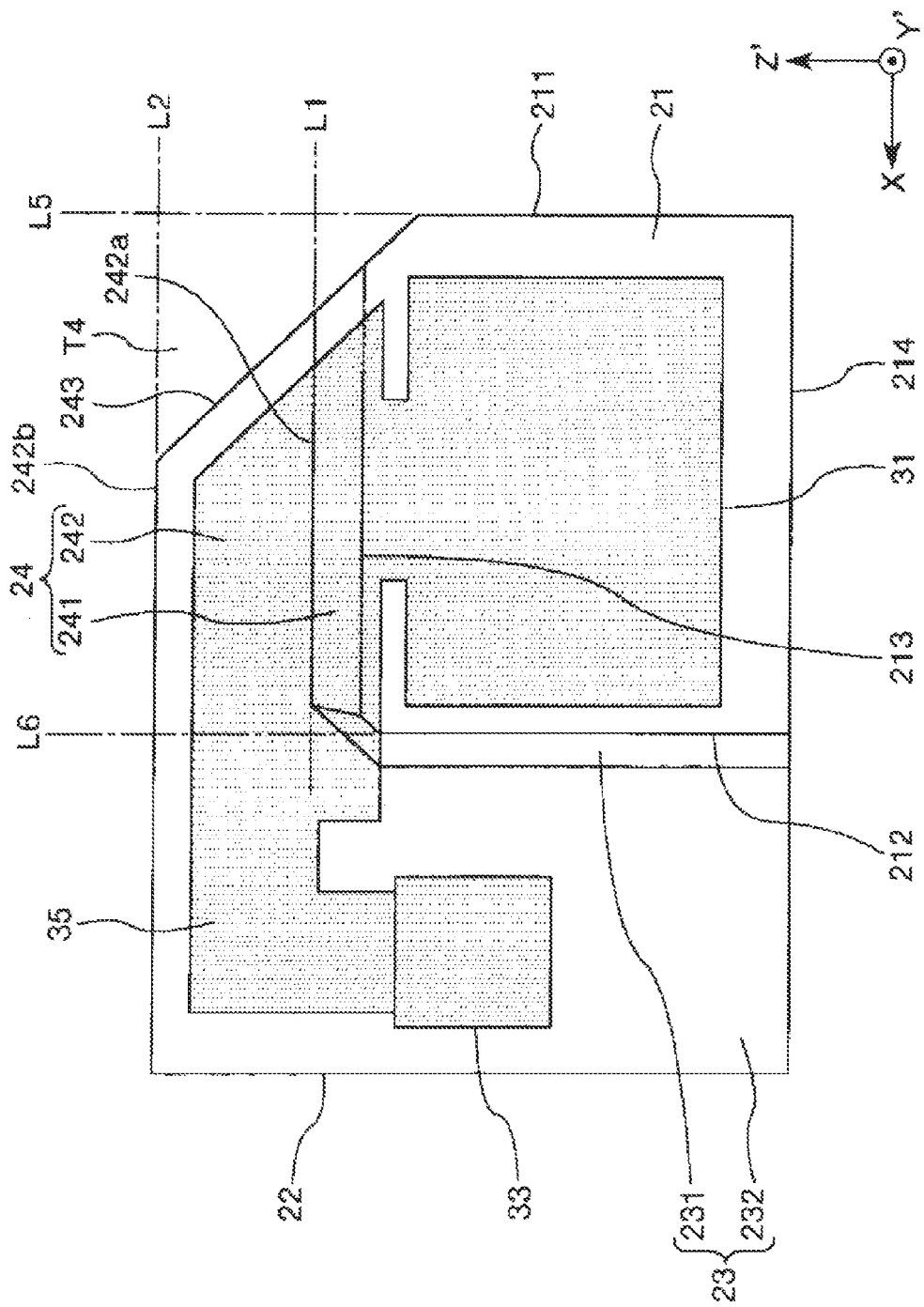
FIG. 8 is a plan view of the resonator element illustrated in FIG. 1.
Figure 9:
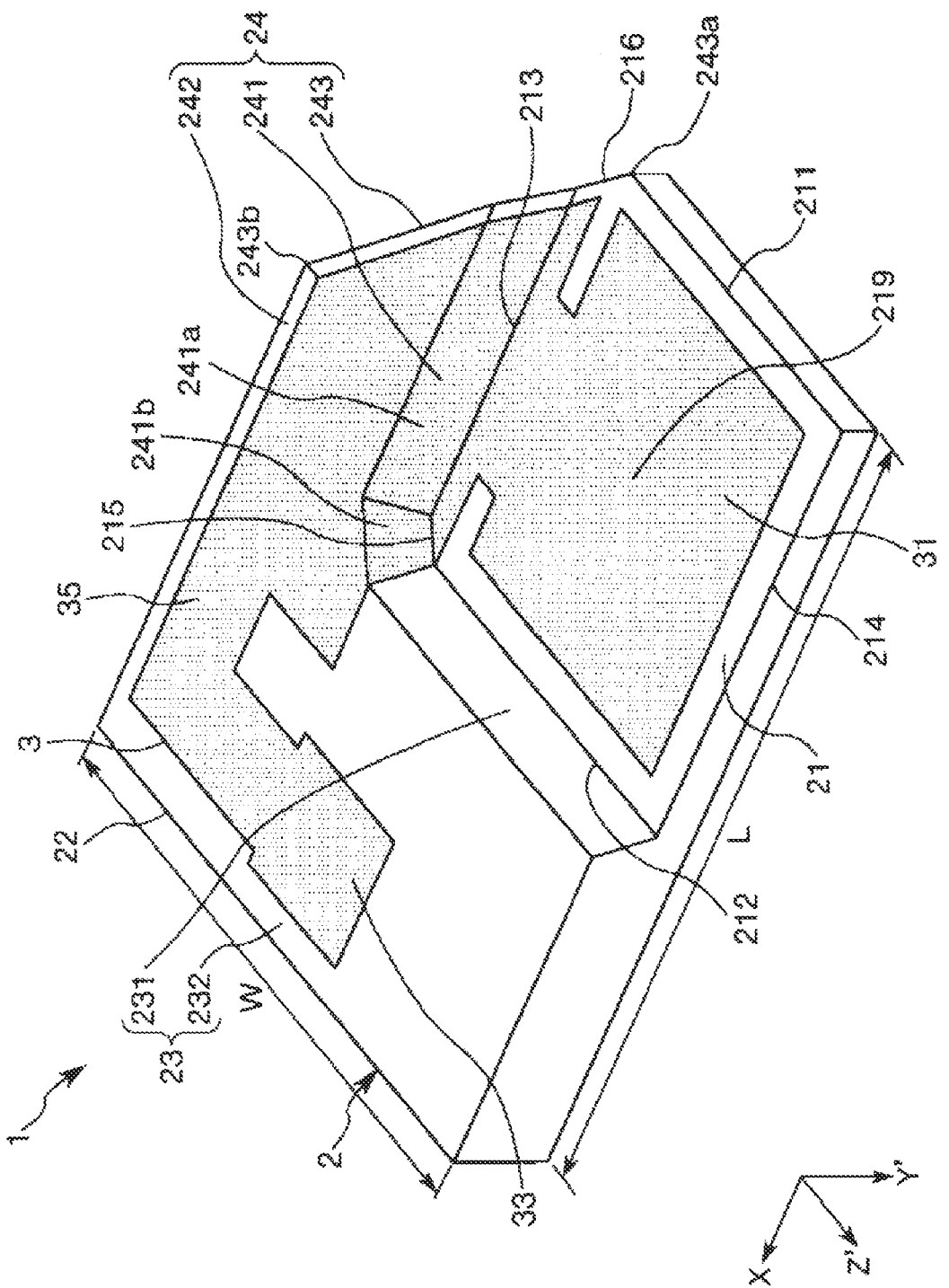
FIG. 9 is a perspective view illustrating a modification example of the resonator element illustrated in FIG. 1.
Figure 10:
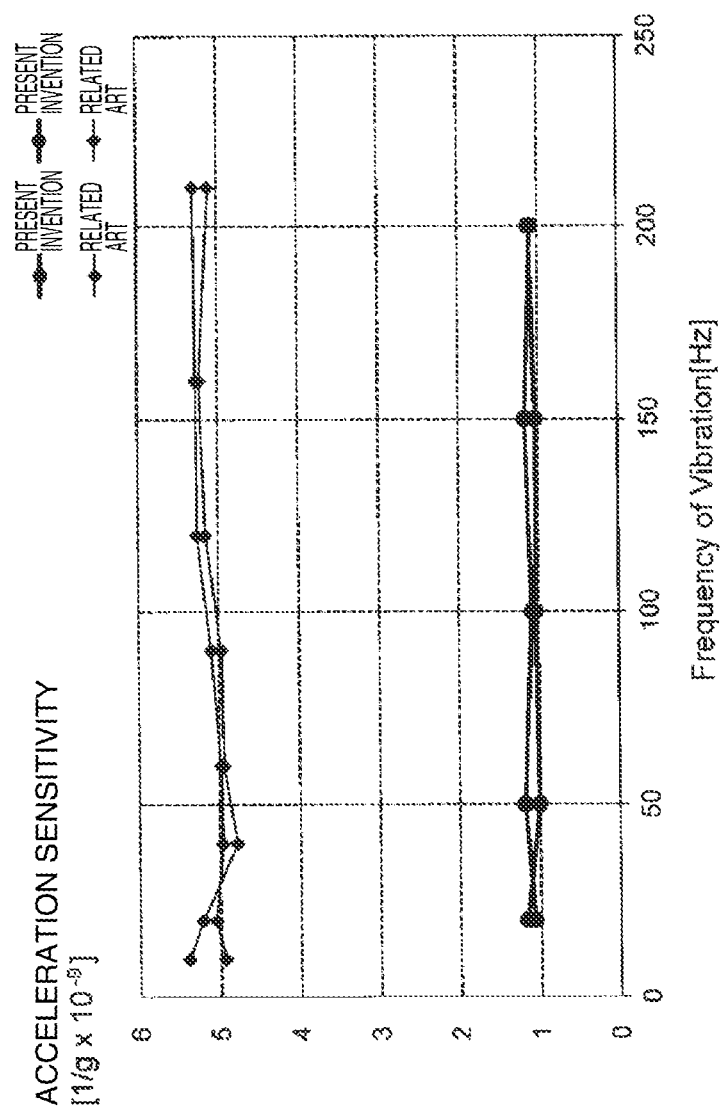
FIG. 10 is a graph illustrating acceleration sensitivity of the resonator element illustrated in FIG. 1.

FIG. 1 is a perspective view of a resonator element according to a first embodiment of the invention, FIG. 2 is a plan view of the resonator element illustrated in FIG. 1, FIG. 3 is a view describing a relationship between an AT cut quartz crystal substrate and crystal axes of quartz crystal, FIG. 4 is a side view illustrating a state where the resonator element illustrated in FIG. 1 is fixed to an object, FIGS. 5 and 6 are plan views illustrating modification examples of the resonator element illustrated in FIG. 1, respectively, FIGS. 7 and 8 are plan views of the resonator element illustrated in FIG. 1, respectively, FIG. 9 is a perspective view illustrating a modification example of the resonator element illustrated in FIG. 1, and FIG. 10 is a graph illustrating acceleration sensitivity of the resonator element illustrated in FIG. 1. In addition, hereinafter, for convenience of description, a right side is referred to as a leading end and a left side is referred to as a base end in FIG. 2.

As illustrated in FIGS. 1 and 2, a resonator element 1 has a piezoelectric substrate (substrate) 2 and an electrode 3 formed on the piezoelectric substrate 2.

Piezoelectric Substrate

The piezoelectric substrate 2 is a plate-like quartz crystal substrate. Here, the quartz crystal that is a material of the piezoelectric substrate 2 belongs to a trigonal system and has crystal axes X, Y and Z orthogonal to each other as illustrated in FIG. 3. The X axis, the Y axis and the Z axis are referred to as an electric axis, a mechanical axis and an optical axis, respectively. The piezoelectric substrate 2 of the embodiment is "a rotated Y-cut quartz crystal substrate" which is cut along a plane that is rotated by a predetermined angle θ from a XZ plane around the X axis. For example, the substrate is referred to as "an AT cut quartz crystal substrate" when the substrate is cut along a plane that is rotated by θ=35° 15'. The resonator element 1 has excellent temperature characteristics by using such a quartz crystal substrate. However, the piezoelectric substrate 2 is not limited to the AT cut piezoelectric substrate and, for example, may use a BT-cut or SC-cut piezoelectric substrate if thickness-shear vibration can be excited.

In addition, hereinafter, the Y axis and the Z axis rotated around the X axis in response to an angle θ are referred to as a Y' axis and a Z' axis. That is, the piezoelectric substrate 2 has a thickness in a Y' axis direction and has an area in a XZ' plane direction.

The piezoelectric substrate 2 has a substantially longitudinal shape in a plan view in which a direction along the X axis is a long side and a direction along the Z' axis is a short side. Furthermore, the piezoelectric substrate 2 is configured such that a −X axis direction is a leading side and a +X axis direction is aside of the base end. If a maximum length of the piezoelectric substrate 2 in the direction along the X axis is L, and a maximum width in the direction along the Z' axis is W, L/W is not particularly limited and, for example, it is preferable that L/W be approximately 1.1 to 1.4.

As illustrated in FIGS. 1 and 2, the piezoelectric substrate 2 has a vibration section (a first region) 21 including a thin vibration region (a region in which vibration energy is trapped) 219, and a thick section (a second region) 22 which is integrally formed with the vibration section 21 and has a thickness thicker than that of the vibration region 219. For example, the vibration section 21 can be formed by forming a recess section by wet etching on a main surface of the quartz crystal substrate on the side of a +Y' axis.

The vibration section 21 is biased on the side in the −X axis direction and −Z' axis direction with respect to the center of the piezoelectric substrate 2, and a part of an outer edge thereof is exposed from the thick section 22. Here, it is preferable that the area of the vibration section 21 be ½ or less of the area of the piezoelectric substrate 2 in a plan view of the resonator element 1. Therefore, since the thick section 22 which is thicker than the vibration section 21 and has a high mechanical strength can be formed wide enough, it is possible to sufficiently secure the rigidity of the resonator element 1 (the vibration section 21). Thus, it is possible to effectively reduce deflection of the piezoelectric substrate 2 in the thickness direction due to acceleration (vibration and impact) in the Y' axis direction and it is possible to reduce the sensitivity with respect to the acceleration in the Y' axis direction. In addition, it is possible to effectively reduce occurrence of an unnecessary vibration mode or the like.

When seen in a plan view of the resonator element 1, the vibration section 21 has a pair of first outer edges 211 and 212 which are spaced apart from each other in the X axis direction (a vibration direction of thickness-shear vibration) and extend in the Z' axis direction (a direction intersecting the X axis direction), and a pair of second outer edges 213 and 214 which are spaced apart from each other in the Z' axis direction and extend in the X axis direction. Out of the first outer edges 211 and 212, the first outer edge 211 is positioned on the side of the −X axis and the first outer edge 212 is positioned on the side of the +X axis. In addition, out of the second outer edges 213 and 214, the second outer edge 213 is positioned on the side of the +Z' axis and the second outer edge 214 is positioned on the side of the −Z' axis.

In addition, the vibration section 21 further has a third outer edge 215 connecting an end of the first outer edge 212 on the side of the +Z' axis and an end of the second outer edge 213 on the +X axis side. The third outer edge 215 is provided by intersecting with both axes of the X axis and Z' axis. An inclination angle of the third outer edge 215 with respect to the X axis is not particularly limited and it is preferable that the inclination angle be approximately 30° or more and 65° or less. For example, regarding stress which occurs due to mounting of a pad electrode 33 if the pad electrode 33 of a thick section body 232 of a first thick section 23 is mounted on the substrate of a package or the like as a fixing section, it is possible to relieve stress concentration in the vicinity of a boundary between the first outer edge 212 and the second outer edge 213 by providing the third outer edge 215. Therefore, it is possible to reduce distortion of the vibration section 21 due to the stress. Thus, it is possible to improve the vibration characteristics of the resonator element 1.

In addition, the vibration section 21 further has a fourth outer edge 216 connecting an end of the first outer edge 211 on the side of the +Z' axis and an end of the second outer edge 213 on the side of the −X axis. The fourth outer edge 216 is configured of a part of an outer edge section 243 described below.

As illustrated in FIG. 1, a surface (a main surface on the side of the +Y' axis) of the thick section 22 is provided to protrude to the side in the +Y' axis direction from a surface (a main surface on the side in the +Y' axis direction) of the vibration section 21. On the other hand, a back surface (a main surface on the side in the −Y' axis direction) of the thick section 22 is provided on the same plane as a back surface (a main surface on the side in the −Y' axis direction) of the vibration section 21.

The thick section 22 has the first thick section 23 disposed along the first outer edge 212 and a second thick section 24 disposed along the second outer edge 213 and the third outer edge 215, and connected to the first thick section 23. Thus, the thick section 22 includes a structure which is bent along the vibration section 21 and has a substantially L-shape in a plan view. On the other hand, the thick section 22 is not formed in the first outer edge 211, the second outer edge 214, and the fourth outer edge 216 of the vibration section 21, and the outer edges 211, 214 and 216 are exposed from the thick section 22. As described above, it is possible to decrease the mass of the resonator element 1 on the side of the leading end while securing the rigidity of the resonator element 1 (the vibration section 21) by providing the thick section 22 partially on the outer edges of the vibration section 21 and by making the thick section 22 have the substantially L-shape, and by not providing the thick section 22 along the first outer edge 211, the second outer edge 214 and the fourth outer edge 216. In addition, it is possible to reduce the size of the resonator element 1.

Here, it is possible to shorten the width (the length in the X axis direction) of an inclination section 231 described below by providing the first thick section 23 on the side of the +X axis with respect to the vibration section 21, compared to a case where the first thick section 23 is provided on the side of the −X axis. Similarly, it is possible to shorten the width (the length in the Z' axis direction) of an inclination section 241 described below by providing the second thick section 24 on the side of the +Z' axis with respect to the vibration section 21, compared to a case where the second thick section 24 is provided on the side of the −Z' axis. Thus, according to the thick section 22, it is possible to reduce the size of the resonator element 1.

The first thick section 23 includes the inclination section (residual section) 231 which is connected to the first outer edge 212 and has a thickness which gradually increases toward the +X axis direction, and the thick section body 232 which is connected to the edge of the inclination section 231 on the side in the +X axis direction and has a substantially constant thickness. Similarly, the second thick section 24 includes the inclination section (residual section) 241 which is connected to the second outer edge 213 and the third outer edge 215, and has a thickness gradually increasing toward the +Z' axis direction, and a thick section body 242 which is connected to the edge of the inclination section 241 on the side in the +Z' axis direction and has a substantially constant thickness. In addition, the second thick section 24 has the outer edge section 243 which is connected to the leading portion thereof in a direction intersecting with both axes of the X axis and the Z' axis in a plan view of the resonator element 1. The outer edge section 243 is provided so as to cut a corner section which is positioned on the side of the −X axis and on the side of the +Z' axis of the piezoelectric substrate 2. The outer edge section 243 is formed across the thick section body 242, the inclination section 241 and the vibration section 21. Therefore, the outer edge section 243 is configured such that an end 243a on the side of the leading end thereof is positioned in the vibration section 21 and, as described above, a part thereof configures the fourth outer edge 216. As described below, it is possible to obtain the resonator element 1 which is reduced in sensitivity with respect to the acceleration (vibration and impact) in the Y' axis direction, that is, is unlikely to receive an effect of the acceleration in the Y' axis direction by providing the outer edge section 243.

In addition, a mounting section (fixing section) 29 is provided on a surface of the thick section body 232 of the first thick section 23, that is, on the side of the base end of the resonator element 1. As illustrated in FIG. 4, the resonator element 1 is fixed to an object 92 by using adhesive 91 in the mounting section 29. In addition, the position of the mounting section 29 is not particularly limited and, for example, may be provided on the back surface of the thick section body 232.

Electrode

The electrode 3 has a pair of excitation electrodes 31 and 32, a pair of pad electrodes 33 and 34, and a pair of extraction electrodes 35 and 36. The excitation electrode 31 is formed on the surface of the vibration region 219. On the other hand, the excitation electrode 32 is disposed on the back surface of the vibration region 219 by facing the excitation electrode 31. The excitation electrodes 31 and 32 have substantially rectangular shapes having a long axis in the X axis direction and a short axis in the Z' axis direction, respectively. In addition, the area of the excitation electrode 32 on the side of the back surface is greater than that of the excitation electrode 31 on the side of the front surface, and an entire region of the excitation electrode 31 is positioned in the excitation electrode 32 in a plan view of the resonator element 1. In addition, the excitation electrodes 31 and 32 are disposed so as to have overlapping centers thereof with respect to each other in the X axis direction in a plan view of the resonator element 1.

The pad electrode 33 is formed in the mounting section 29 of the surface of the thick section body 232. On the other hand, the pad electrode 34 is formed on the back surface of the thick section body 232 by facing the pad electrode 33.

The extraction electrode 35 extends from the excitation electrode 31 and the excitation electrode 31 and pad electrode 33 are electrically connected to each other through the extraction electrode 35. The extraction electrode 35 is drawn to the surface of the thick section 22 through surfaces 241a and 241b across the surface 241a which is connected to the second outer edge 213 of the inclination section 241 and the surface 241b which is connected to the third outer edge 215. Therefore, since the width of the extraction electrode 35 can be wide, it is possible to reduce resistance of the extraction electrode 35.

Sizes of the pair of excitation electrodes 31 and 32 are different from each other, and the excitation electrode 32 having a large size encloses the excitation electrode 31 having a small size in a plan view. Thus, a region is present in which the extraction electrode 35 extending from the excitation electrode 31 having the small size overlaps with the excitation electrode 32 having the large size. If the area of the region is large, the region serves as a vibration region different from the vibration region which is sandwiched by the pair of excitation electrodes 31 and 32, and is a cause of occurrence of unnecessary spurious vibration in the vicinity of the resonance frequency. Accordingly, the area of the overlapping region is reduced by narrowing a width of a connecting region by an incision in the connecting region between the excitation electrode 31 and the extraction electrode 35. Therefore, it is possible to reduce occurrence of the unnecessary spurious vibration in the vicinity of the resonance frequency by reducing the area of the overlapping region.

In addition, the extraction electrode 36 extends from the excitation electrode 32, and the excitation electrode 31 and the pad electrode 34 are electrically connected to each other through the extraction electrode 36. The extraction electrode 36 is provided so as not to overlap with the extraction electrode 35 through the piezoelectric substrate 2 in a plan view. Therefore, it is possible to suppress electrostatic capacitance between the extraction electrodes 35 and 36. In addition, the extraction electrodes 35 and 36 do not invade the mounting section 29 more than required, and a region T1 in which the electrode 3 is not formed is present in the mounting section 29 (particularly, the edge thereof) in a plan view of the resonator element 1. In the embodiment, the region T1 is present on the side of the leading end and on the side of the base end with the pad electrodes 33 and 34 being sandwiched therebetween in a plan view. Since the quartz crystal substrate configuring the piezoelectric substrate 2 has optical transparency, it is possible to visually recognize a background (scenery of the other side of the resonator element 1) over the mounting section 29 from the side of the back surface of the resonator element 1 by using the configuration described above. Thus, as illustrated in FIG. 4, when bringing the adhesive 91 into contact with the mounting section 29, it is possible to visually recognize the adhesive 91 over the resonator element 1, and it is possible to accurately control the positioning of the adhesive 91, the contact area with the adhesive 91, the shape of the adhesive 91 or the like.

For example, the electrode 3 described above can be configured of a metal film which is formed by laminating Au (gold) or an alloy mainly composed of Au (gold) on a base layer of Cr (chromium), Ni (nickel) or the like.

The resonator element 1 is described above. As described above, it is possible to decrease the mass of the resonator element 1 on the side of the leading end while securing the rigidity of the resonator element 1 on the side of the leading end by providing the second thick section 24 in the resonator element 1 and by providing the outer edge section 243 in the second thick section 24. Thus, as illustrated in FIG. 4, it is possible to reduce an amount of bending of the resonator element 1 on the side of the leading end (on the side of a free end) when applying an angular velocity to the resonator element 1 in the Y' axis direction, in a fixed state to the object through the adhesive in the mounting section 29. As a result, it is possible to reduce variation in the vibration characteristics due to the acceleration in the Y' axis direction and it is possible to reduce the sensitivity of the resonator element 1 with respect to the acceleration in the Y' axis direction. Therefore, the resonator element 1 can exhibit stable vibration characteristics regardless of whether or not the acceleration is applied in the Y' axis direction. Particularly, as in the embodiment, it is possible to further decrease the mass of the resonator element 1 on the side of the leading end (on the side of the free end) and the advantage described above is more remarkable by forming the outer edge section 243 across the thick section body 242, the inclination section 241 and the vibration section 21.

Here, as illustrated in FIG. 2, if an overlapping region of the second thick section 24 with the excitation electrode 31 in the X axis direction is a center region (a first thick section region) T21, a region on the side of the leading end from the center region T21 is a leading end side region (a second thick section region) T22, and a region on the side of the base end from the center region T21 is a base end side region (a third thick section region) T23, in a plan view of the resonator element 1, the outer edge section 243 is formed across the leading end side region T22 and the center region T21. In other words, an end 243b of the outer edge section 243 on the side of the base end is positioned in the center region T21. Therefore, it is possible to appropriately leave a portion of the second thick section 24 on the side of the leading end, and it is possible to realize securing of the rigidity of the resonator element 1 (the vibration section 21) and the decrease in the mass of the resonator element 1 on the side of the leading end in a balanced manner. Thus, it is possible to further effectively reduce the sensitivity of the resonator element 1 with respect to the acceleration in the Y' axis direction. In addition, it is possible to effectively suppress occurrence of the unnecessary vibration mode.

As a modification example of the embodiment, as illustrated in FIG. 5, an entire region of the outer edge section 243 may be formed in the leading end side region T22. In other words, the end 243b of the outer edge section 243 on the side of the base end may be positioned in the leading end side region T22. Therefore, the effect of the decrease in mass on the side of the leading end is reduced but the effect of securing the rigidity is enhanced with respect to the embodiment. In addition, as illustrated in FIG. 6, the outer edge section 243 may be formed across the leading end side region T22, the center region T21 and the base end side region T23. In other words, the end 243b of the outer edge section 243 on the side of the base end may be positioned in the base end side region T23. Therefore, the effect of securing the rigidity is reduced but the effect of the decrease in the mass on the side of the leading end is enhanced with respect to the embodiment. In addition, the end 243b may be positioned on a boundary between the center region T21 and the leading end side region T22, and may be positioned on a boundary between the center region T21 and the base end side region T23.

For example, the embodiment, the example illustrated in FIG. 5 and the example illustrated in FIG. 6 can be appropriately selected depending on the size (a ratio of the vibration section 21 with respect to the piezoelectric substrate 2) of the vibration section 21, the shape thereof, the width of the second thick section 24, the thickness thereof or the like.

In addition, as illustrated in FIG. 7, if an area of a region T3 is S1 which is surrounded by a straight line L1 conforming to an edge 242a of the thick section body 242 on the side of the −Z' axis, a straight line L2 conforming to an edge 242b on the side of the +Z' axis, a straight line L3 intersecting with the end of the excitation electrode 31 on the side of the −X axis and extending in the Z' axis direction, and a straight line L4 intersecting with the end of the excitation electrode 31 on the side of the +X axis and extending in the Z' axis direction, and an area of the thick section body 242 positioned in the region T3 is S2 in a plan view of the resonator element 1, it is preferable to satisfy a relationship of $0.65 \leq S2/S1 \leq 0.85$, and it is further preferable to satisfy the relationship of $0.74 \leq S2/S1 \leq 0.79$. Therefore, it is possible to appropriately leave the second thick section 24 on the side of the leading end of the resonator element 1, and it is possible to realize the securement of the rigidity of the resonator element 1 (the vibration section 21) and the decrease in the mass of the resonator element 1 on the side of the leading end in a balanced manner.

In addition, as illustrated in FIG. 8, if an area of a region T4 is S3 which is surrounded by the straight line L1, the straight line L2, a straight line (an extension line of the first outer edge 211) L5 intersecting with the end of the vibration section 21 in the −X axis direction and extending in the Z' axis direction, and a straight line (an extension line of the first outer edge 212) L6 intersecting with the end of the vibration section 21 in the +X axis direction and extending in the Z' axis direction, and an area of the thick section body 242 positioned in the region T4 is S4, in a plan view of the resonator element 1, it is preferable to satisfy a relationship of $S4/S3 \leq 0.75$, and it is further preferable to satisfy the relationship of $S4/S3 \leq 0.69$. Therefore, it is possible to effectively decrease the mass of the resonator element 1 on the side of the leading end.

The resonator element 1 is described above. In the resonator element 1 of the embodiment, the vibration section 21 is formed by forming the recess section of the piezoelectric substrate 2 on the side of the +Y' axis, and the thick section 22 is configured of the first thick section 23 positioned on the side of the +X axis with respect to the vibration section 21 and the second thick section 24 positioned on the side of the +Z' axis but the resonator element 1 may have a configuration in which the configuration described above is turned over. That is, as illustrated in FIG. 9, the vibration section 21 is formed by forming the recess section of the piezoelectric substrate 2 on the side of the −Y' axis, and the thick section 22 may be configured of the first thick section 23 positioned on the side of the +X axis with respect to the vibration section 21 and the second thick section 24 positioned on the side of the −Z' axis. Also in this configuration, the same effect (particularly, the effect capable of narrowing the width of the inclination sections 231 and 241) as the embodiment can be exhibited.

For the resonator element 1 of the embodiment, the acceleration sensitivity ($1/g \times 10^{-9}$) was measured by using two samples. The results thereof are illustrated in Table 1 and FIG. 10. In addition, the frequency of the vibration applied to the resonator element during measurement was "frequency of vibration f (Hz)".

TABLE 1

| Frequency of Vibration f [Hz] | Acceleration Sensitivity [1/g × 10⁻⁹] | | | |
|---|---|---|---|---|
| | Related Art | | Present Invention (Resonator Element 1) | |
| | Sample 1 | Sample 2 | Sample 1 | Sample 2 |
| 10 | 5.39 | 4.94 | 1.16 | 0.96 |
| 20 | 5.22 | 5.05 | 1.07 | 1.16 |
| 40 | 4.78 | 4.97 | — | — |
| 50 | — | — | 1.18 | 1.00 |
| 60 | 4.94 | 4.98 | — | — |
| 90 | 4.97 | 5.10 | — | — |
| 100 | — | — | 1.09 | 1.05 |
| 120 | 5.16 | 5.26 | — | — |
| 150 | — | — | 1.17 | 1.04 |
| 160 | 5.23 | 5.28 | — | — |
| 200 | — | — | 1.09 | 1.11 |
| 210 | 5.11 | 5.30 | — | — |

It can be seen from Table 1 and FIG. 10 that the acceleration sensitivity of the resonator element 1 (the invention) is significantly reduced compared to that of the resonator element of the related art.

Second Embodiment

Next, a second embodiment of a resonator element according to the invention will be described.

Figure 11:
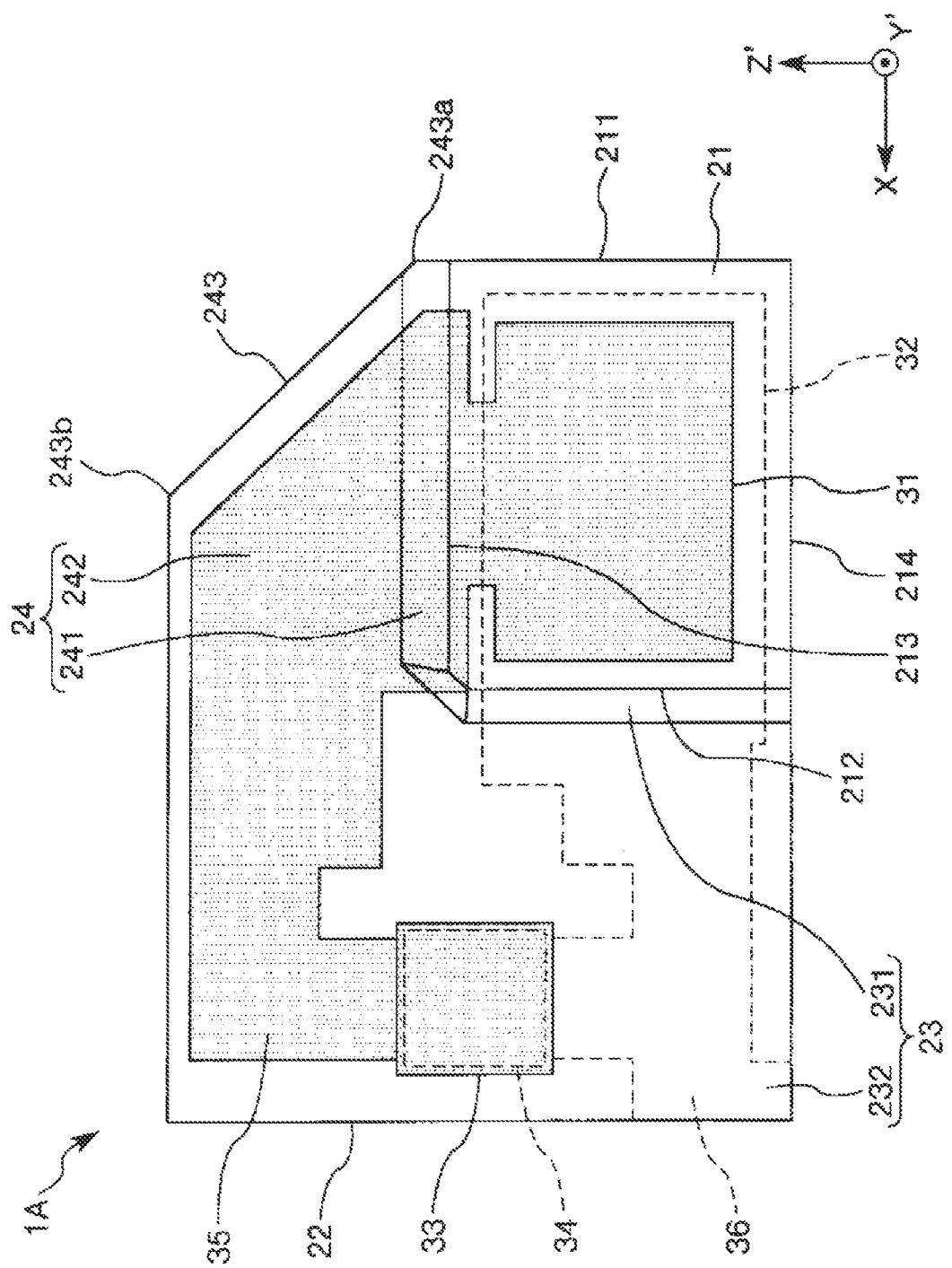
FIG. 11 is a plan view of a resonator element according to a second embodiment of the invention.

FIG. 11 is a plan view of the resonator element according to the second embodiment of the invention.

Hereinafter, the resonator element of the second embodiment is described focusing on differences from the first embodiment described above and the description of similar matters is omitted.

The resonator element according to the second embodiment of the invention is the same as that of the first embodiment described above except that the configuration of the outer edge section is different from the first embodiment described above. In addition, the same reference numerals are given to the same configurations as the first embodiment described above.

As illustrated in FIG. 11, in a resonator element 1A of the embodiment, the outer edge section 243 is formed across the thick section body 242 and the inclination section 241. In other words, the end 243a of the outer edge section 243 on the side of the leading end is positioned in the inclination section 241. Therefore, the effect of the decrease in the mass on the side of the leading end is reduced but the effect of securing of the rigidity is improved with respect to the first embodiment described above.

In addition, it is preferable to satisfy the relationship between the areas of S1 and S2 of 0.65≤S2/S1≤0.85, and it is further preferable to satisfy the relationship of 0.79≤S2/S1≤0.85. Therefore, it is possible to appropriately leave the second thick section 24 on the side of the leading end of the resonator element 1A, and it is possible to realize the securement of the rigidity of the resonator element 1A and the decrease in the mass on the side of the leading end in a balanced manner.

In addition, it is preferable to satisfy the relationship between the areas of S3 and S4 of S4/S3≤0.75, and it is further preferable to satisfy the relationship of S4/S3≤0.72.

Therefore, it is possible to effectively decrease the mass of the resonator element 1A on the side of the leading end.

The same effect as that of the first embodiment described above can be exhibited also in the second embodiment. In addition, even in this embodiment, as illustrated in FIGS. 5 and 6, the end 243b of the outer edge section 243 on the side of the base end may be positioned in the leading end side region T22 or may be positioned in the base end side region T23.

Third Embodiment

Next, a third embodiment of a resonator element of the invention will be described.

Figure 12:
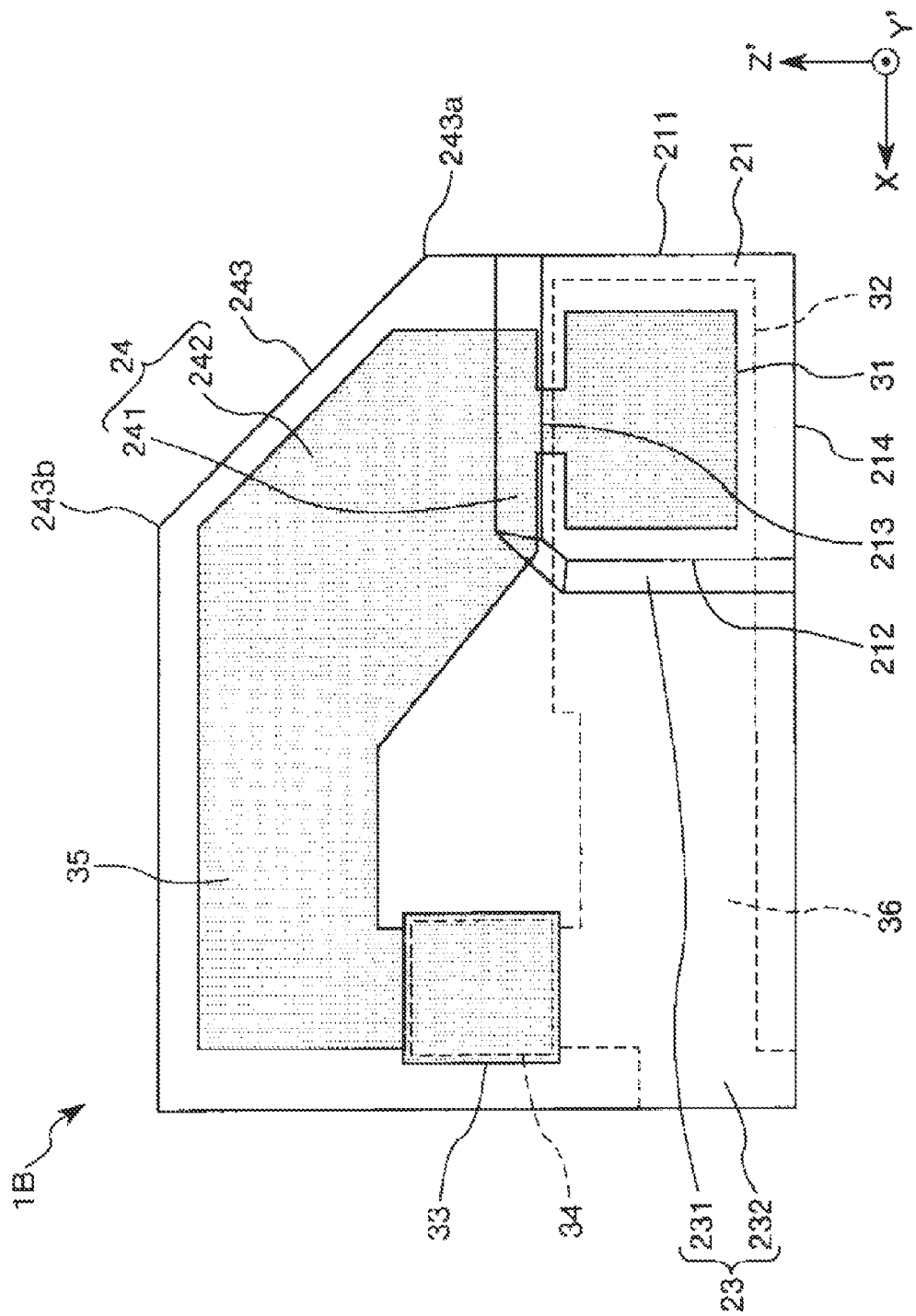
FIG. 12 is a plan view of a resonator element according to a third embodiment of the invention.

FIG. 12 is a plan view of the resonator element according to the third embodiment of the invention.

Hereinafter, the resonator element of the third embodiment is described focusing on differences from the first embodiment described above and the description of similar matters is omitted.

The resonator element according to the third embodiment of the invention is the same as that of the first embodiment described above except that the configuration of the outer edge section is different from the first embodiment described above. In addition, the same reference numerals are given to the same configurations as the first embodiment described above.

As illustrated in FIG. 12, in a resonator element 1B of the embodiment, an entirety of the outer edge section 243 is formed in the thick section body 242. In other words, the end 243a of the outer edge section 243 on the side of the leading end is positioned in the thick section body 242. Therefore, the effect of the decrease in the mass on the side of the leading end is reduced but the effect of securing the rigidity is improved with respect to the first embodiment and the second embodiment described above.

In addition, it is preferable to satisfy the relationship between the areas of S1 and S2 of 0.65≤S2/S1≤0.85, and it is further preferable to satisfy the relationship of 0.68≤S2/S1≤0.69. Therefore, it is possible to appropriately leave the second thick section 24 on the side of the leading end of the resonator element 1B, and it is possible to realize the securement of the rigidity of the resonator element 1B and the decrease in the mass on the side of the leading end in a balanced manner.

In addition, it is preferable to satisfy the relationship between the areas of S3 and S4 of S4/S3≤0.75, and it is further preferable to satisfy the relationship of S4/S3≤0.66. Therefore, it is possible to effectively decrease the mass of the resonator element 1B on the side of the leading end.

The same effect as that of the first embodiment described above can be exhibited even in the third embodiment. In addition, even in this embodiment, as illustrated in FIGS. 5 and 6, the end 243b of the outer edge section 243 on the side of the base end may be positioned in the leading end side region T22 or may be positioned in the base end side region T23.

Fourth Embodiment

Next, a fourth embodiment of a resonator element of the invention will be described.

Figure 13:
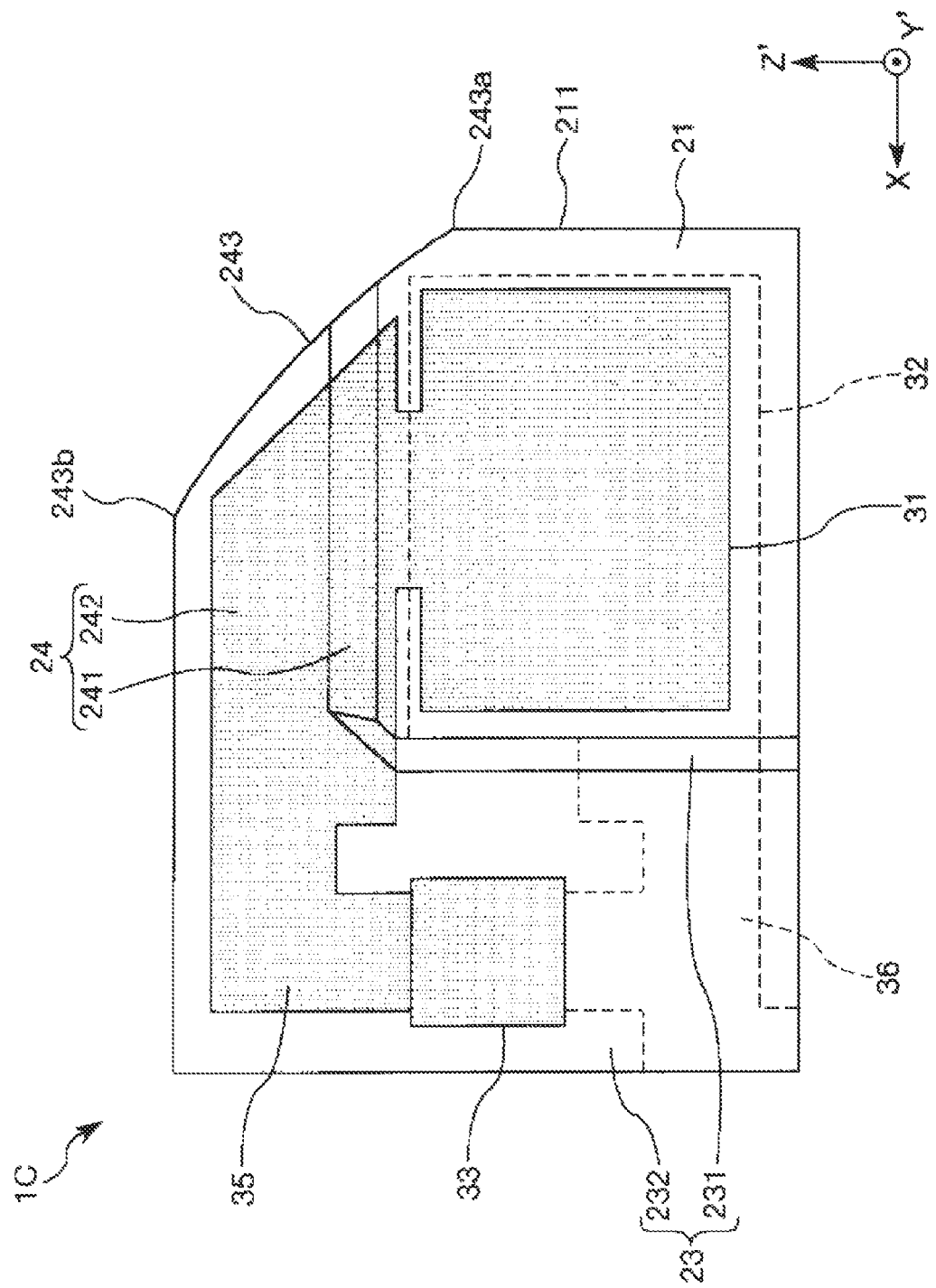
FIG. 13 is a plan view of a resonator element according to a fourth embodiment of the invention.

FIG. 13 is a plan view of the resonator element according to the fourth embodiment of the invention.

Hereinafter, the resonator element of the fourth embodiment is described focusing on differences from the first embodiment described above and the description of similar matters is omitted.

The resonator element according to the fourth embodiment of the invention is the same as that of the first embodiment described above except that the configuration of the outer edge section is different from the first embodiment described above. In addition, the same reference numerals are given to the same configurations as the first embodiment described above.

As illustrated in FIG. 13, in a resonator element 1C of the embodiment, the outer edge section 243 is bent so as to protrude to the outside. Therefore, it is possible to relieve the stress concentration in the vicinity of both the ends 243a and 243b of the outer edge section 243. In addition, an entire region of the outer edge section 243 may not be bent and only a part thereof may be bent.

The same effect as that of the first embodiment described above can be exhibited even in the fourth embodiment described above.

Fifth Embodiment

Next, a fifth embodiment of a resonator element of the invention will be described.

Figure 14:
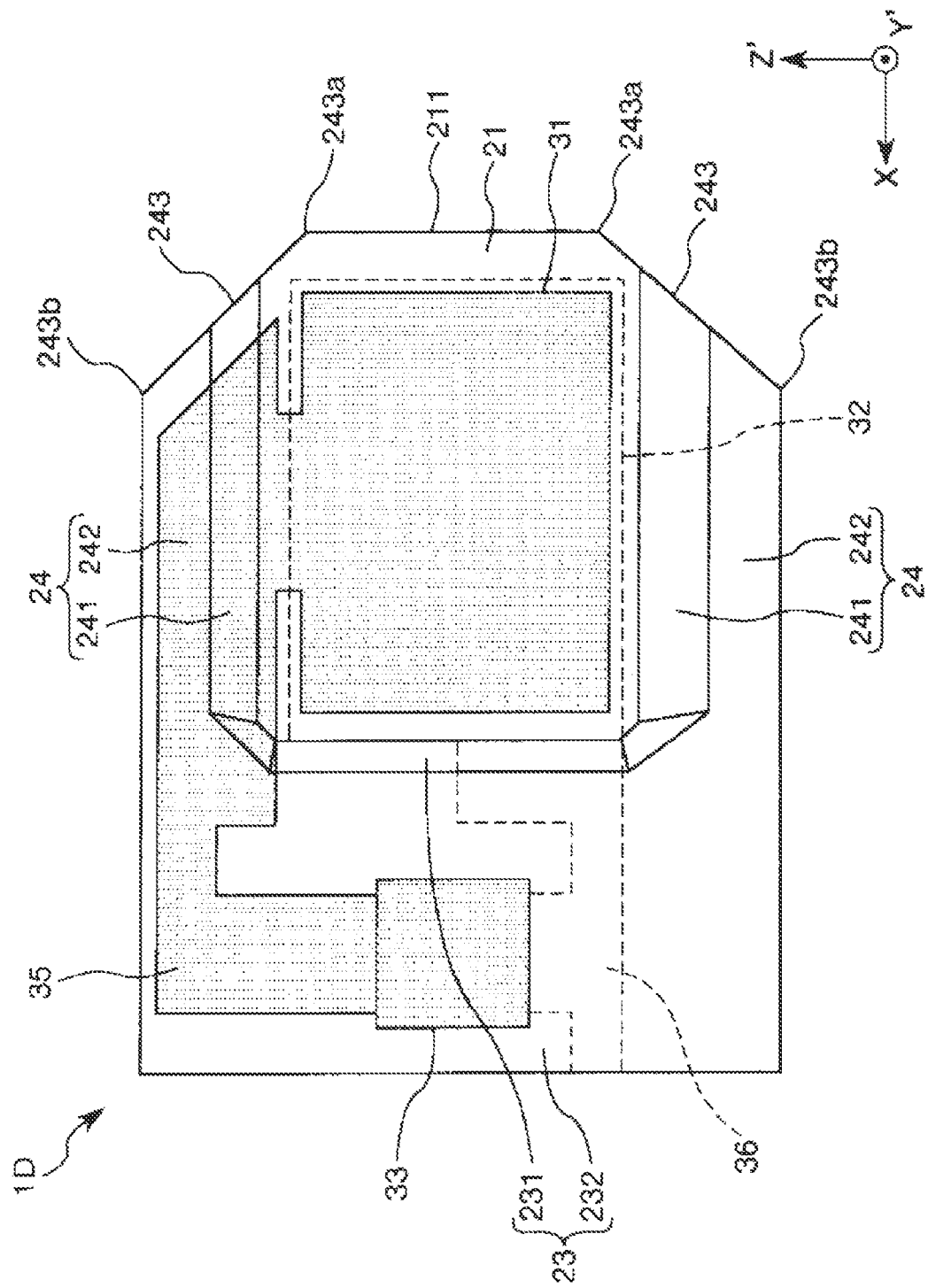
FIG. 14 is a plan view of a resonator element according to a fifth embodiment of the invention.
Figure 15:
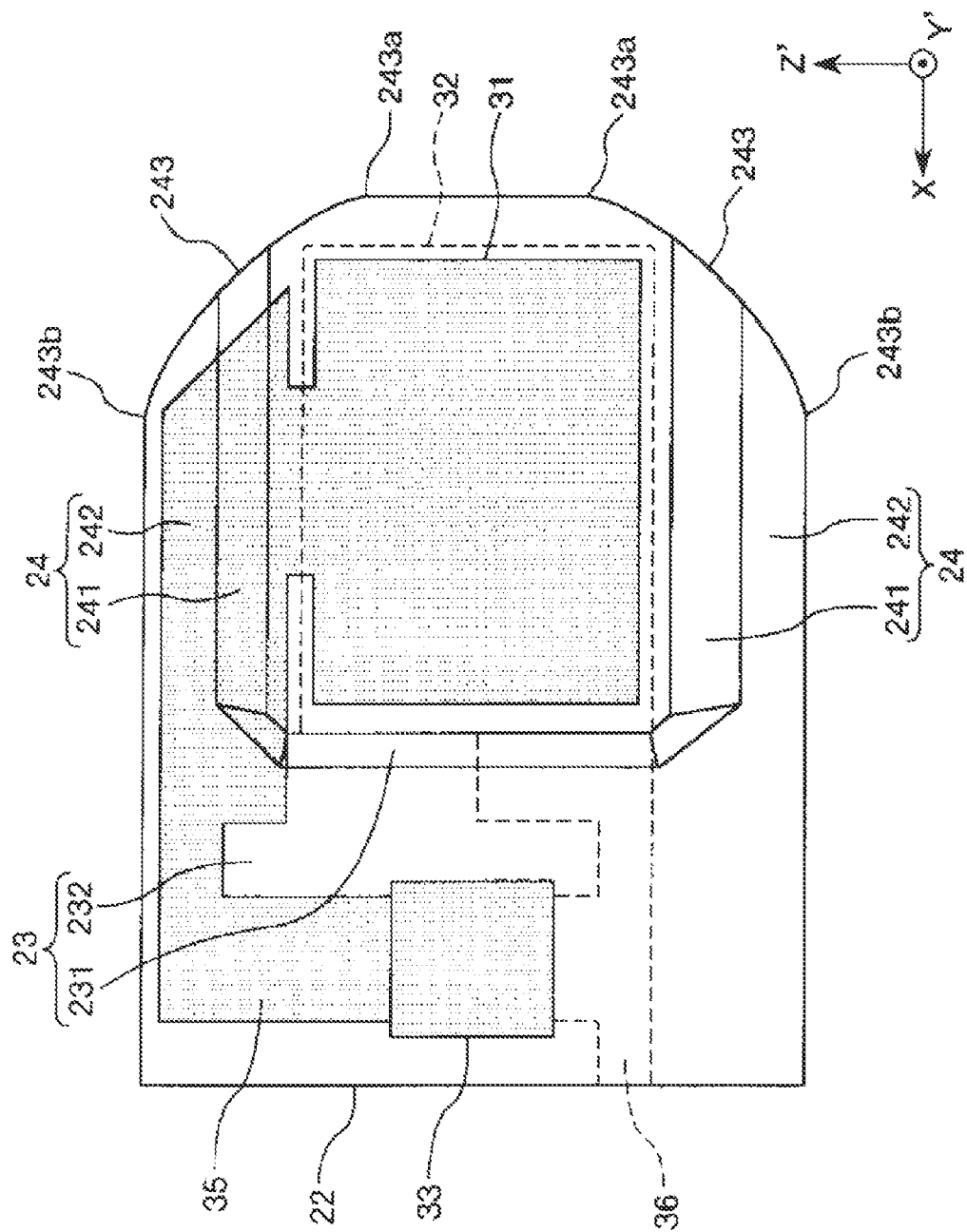
FIG. 15 is a plan view illustrating a modification example of the resonator element illustrated in FIG. 14.

FIG. 14 is a plan view of the resonator element according to the fifth embodiment of the invention and FIG. 15 is a plan view illustrating a modification example of the resonator element illustrated in FIG. 14.

Hereinafter, the resonator element of the fifth embodiment is described focusing on differences from the first embodiment described above and the description of similar matters is omitted.

The resonator element according to the fifth embodiment of the invention is the same as that of the first embodiment described above except that the configuration of the thick section is different from the first embodiment described above. In addition, the same reference numerals are given to the same configurations as the first embodiment described above.

As illustrated in FIG. 14, in a resonator element 1D of the embodiment, a pair of second thick sections 24 are formed so as to sandwich the vibration section 21 therebetween in the Z' axis direction. Since each of the second thick sections 24 has the same configuration as that of the first embodiment, the description thereof is omitted. As described above, it is possible to further increase the rigidity of the resonator element 1D and it is further possible for bending of the vibration section 21 to be difficult by providing the pair of second thick sections. In addition, in the embodiment, since the pair of second thick sections 24 is provided, for example, the width (the length in the Z' axis direction) of each second thick section 24 may be decreased compared to the first embodiment described above.

The same effect as that of the first embodiment described above can be exhibited even in the fifth embodiment described above.

In addition, as illustrated in FIG. 15, the outer edge section 243 included in each second thick section 24 may be bent so as to protrude to the outside. Therefore, it is possible to relieve the stress concentration in the vicinity of both the ends 243a and 243b of each outer edge section 243.

Sixth Embodiment

Next, a sixth embodiment of a resonator element of the invention will be described.

Figure 16:
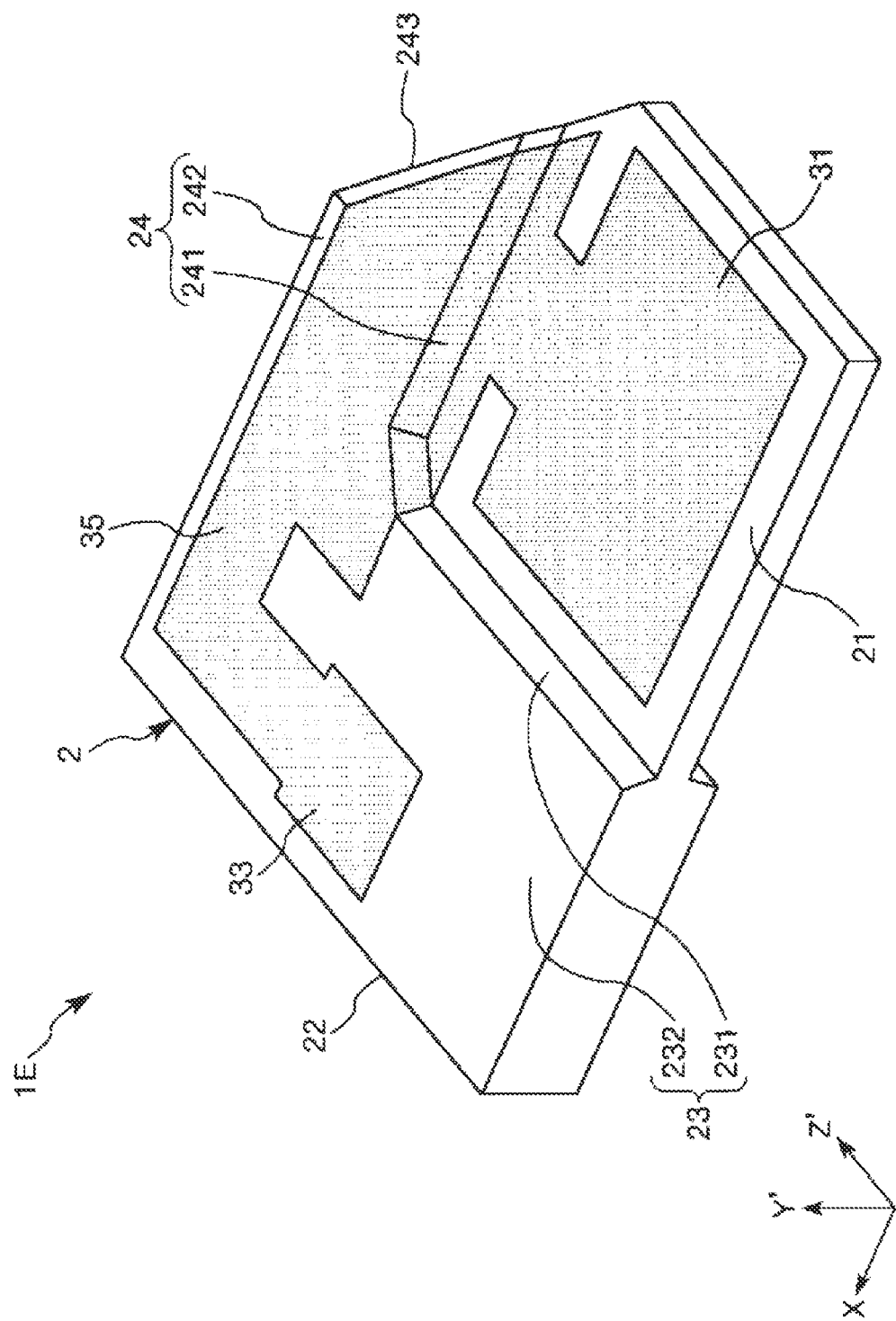
FIG. 16 is a perspective view of a resonator element according to a sixth embodiment of the invention.

FIG. 16 is a perspective view of the resonator element according to the sixth embodiment of the invention.

Hereinafter, the resonator element of the sixth embodiment is described focusing on differences from the first embodiment described above and the description of similar matters is omitted.

The resonator element according to the sixth embodiment of the invention is the same as that of the first embodiment described above except that the configuration of the vibration section is different from the first embodiment described above. In addition, the same reference numerals are given to the same configurations as the first embodiment described above.

As illustrated in FIG. 16, in a resonator element 1E of the embodiment, the vibration section 21 is formed by forming recess sections in both main surfaces of the piezoelectric substrate 2. In other words, the surface (a main surface on the side in the −Y' axis direction) of the thick section 22 is provided by protruding from the surface (a main surface on the side in the +Y' axis direction) of the vibration section 21 in the +Y' axis direction and a back surface (a main surface on the side in the −Y' axis direction) of the thick section 22 is provided by protruding from a back surface (a main surface on the side in the −Y' axis direction) of the vibration section 21 on the side in the −Y' axis direction. As described above, it is possible to make an etched depth of the recess section shallow by forming the vibration section 21 by forming the recess sections on both the main surfaces of the piezoelectric substrate 2, compared to the above-described first embodiment. Thus, it is possible to accurately perform the etching and it is possible to more accurately obtain an outer shape of the piezoelectric substrate 2.

The same effect as that of the first embodiment described above can be exhibited even in the sixth embodiment described above.

In addition, the first embodiment to the sixth embodiment are described using the vibration section 21 of which the outer shape is a rectangular shape but the outer shape of the vibration section 21 according to the invention is not limited to the rectangular shape and may be an elliptical shape or a circular shape. It goes without saying that the outer edge of the vibration section 21 is not limited to a straight line and may include a curve.

2. Resonator

Next, the resonator (the resonator according to the invention) to which the resonator element 1 described above is applied will be described.

Figure 17:
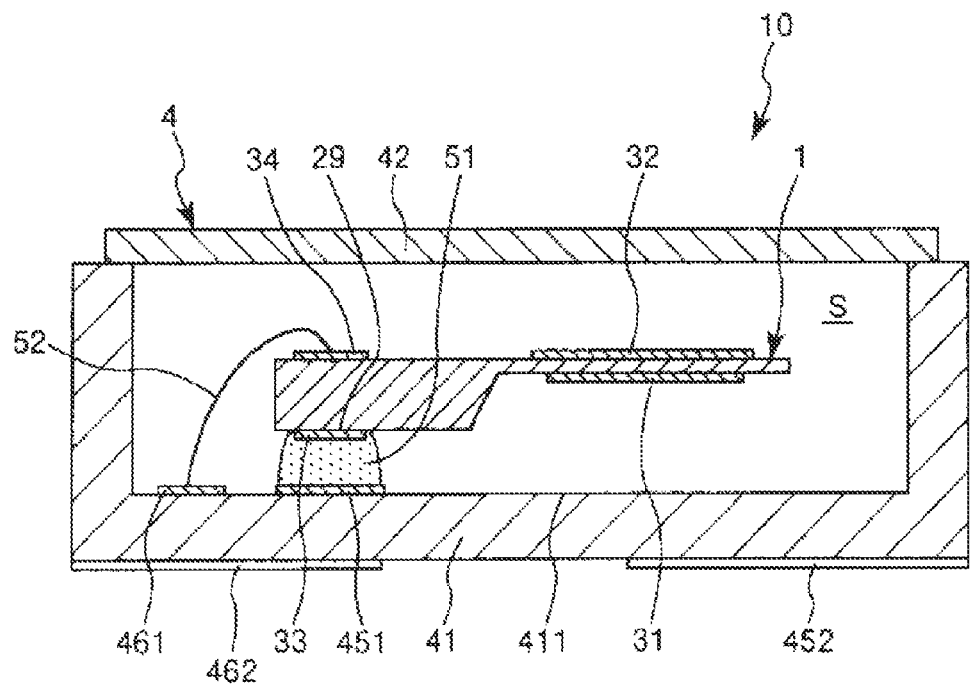
FIG. 17 is a cross-sectional view illustrating a preferred embodiment of a resonator according to the invention.

FIG. 17 is a cross-sectional view illustrating a preferred embodiment of the resonator according to the invention.

A resonator 10 illustrated in FIG. 17 has the resonator element 1 described above and a package 4 accommodating the resonator element 1.

Package

The package 4 has a box-shaped base 41 having a concave section 411 which is open to the upper surface and a plate-shaped lid 42 connected to the base 41 to block an opening of the concave section 411. Then, the resonator element 1 is stored in a storage space S formed by blocking the concave section 411 with the lid 42. The storage space S may be in a decompression (vacuum) state or may enclose an inert gas such as nitrogen, helium or argon.

A configuration material of the base 41 is not particularly limited and various ceramics such as aluminum oxide can be used. In addition, a configuration material of the lid 42 is not particularly limited and may be a member of which a linear expansion coefficient is similar to that of the configuration material of the base 41. For example, if the configuration material of the base 41 is a ceramic described above, it is preferable that the configuration material of the lid 42 be an alloy such as kovar. In addition, the connection between the base 41 and the lid 42 is not particularly limited and, for example, may be connection through adhesive or may be connection using seam welding or the like.

Connecting electrodes 451 and 461 are formed on a bottom surface of the concave section 411 of the base 41. In addition, external mounting terminals 452 and 462 are formed on a lower surface of the base 41. The connecting electrode 451 is electrically connected to the external mounting terminal 452 through a penetration electrode (not illustrated) formed in the base 41 and the connecting electrode 461 is electrically connected to the external mounting terminal 462 through a penetration electrode (not illustrated) formed in the base 41.

Configurations of the connecting electrodes 451 and 461, and the external mounting terminals 452 and 462 are not particularly limited as long as the configurations have conductivity and, for example, a configuration can be of a metal film which is formed by laminating each of a film of Ni (nickel), Au (gold), Ag (silver), Cu (copper) or the like on a metalized layer (base layer) of Cr (chromium), W (tungsten) or the like.

The resonator element 1 stored in the storage space S is fixed to the base 41 by a conductive adhesive 51 in the mounting section 29 to direct the surface thereof toward the base 41. The conductive adhesive 51 is provided by coming into contact with the connecting electrode 451 and the pad electrode 33. Therefore, the connecting electrode 451 and the pad electrode 33 are electrically connected to each other through the conductive adhesive 51. It is possible to suppress the stress occurring in the resonator element 1 due to a difference in coefficients of thermal expansion between the base 41 and the piezoelectric substrate 2 by supporting the resonator element 1 at one place (one point) using the conductive adhesive 51.

The conductive adhesive 51 is not particularly limited as long as the adhesive has conductivity and adhesion, and, for example, it is possible to use one obtained by dispersing conductive filler in an adhesive that is silicone-based, epoxy-based, acrylic-based, polyimide-based, bismaleimide-based or the like.

The pad electrode 34 of the resonator element 1 is electrically connected to the connecting electrode 461 through a bonding wire 52. As described above, since the pad electrode 34 is disposed to face the pad electrode 33, the pad electrode 34 is positioned directly above the conductive adhesive 51 in a state where the resonator element 1 is fixed to the base 41. Thus, it is possible to suppress leakage of the vibration (ultrasonic vibration) applied to the pad electrode 34 when wire bonding is performed and it is possible to further reliably perform the connecting of the bonding wire 52 to the pad electrode 34.

3. Oscillator

Next, the oscillator (the oscillator according to the invention) to which the resonator according to the invention is applied is described.

Figure 18:
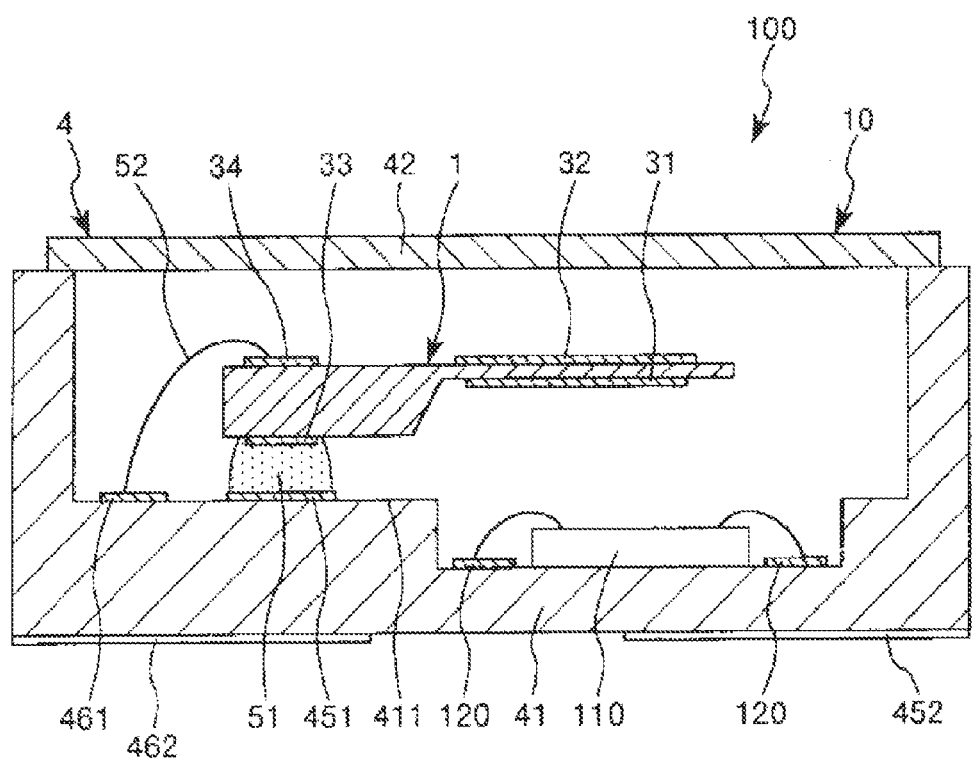
FIG. 18 is a cross-sectional view illustrating a preferred embodiment of an oscillator according to the invention.

FIG. 18 is a cross-sectional view illustrating a preferred embodiment of the oscillator according to the invention.

An oscillator 100 illustrated in FIG. 18 has the resonator 10 and an IC chip 110 for driving the resonator element 1. Hereinafter, the oscillator 100 is described focusing on differences from the resonator described above and the description of similar matters is omitted.

As illustrated in FIG. 18, in the oscillator 100, the IC chip 110 is fixed to the concave section 411 of the base 41. The IC chip 110 is electrically connected to a plurality of internal terminals 120 formed on the bottom surface of the concave section 411. The plurality of internal terminals 120 are connected to the connecting electrodes 451 and 461, and connected to the external mounting terminals 452 and 462. The IC chip 110 has an oscillation circuit for controlling driving of the resonator element 1. If the resonator element 1 is driven by the IC chip 110, it is possible to take out a signal of a predetermined frequency.

4. Electronic Apparatus

Next, the electronic apparatus (the electronic apparatus according to the invention) to which the resonator according to the invention is applied is described.

Figure 19:
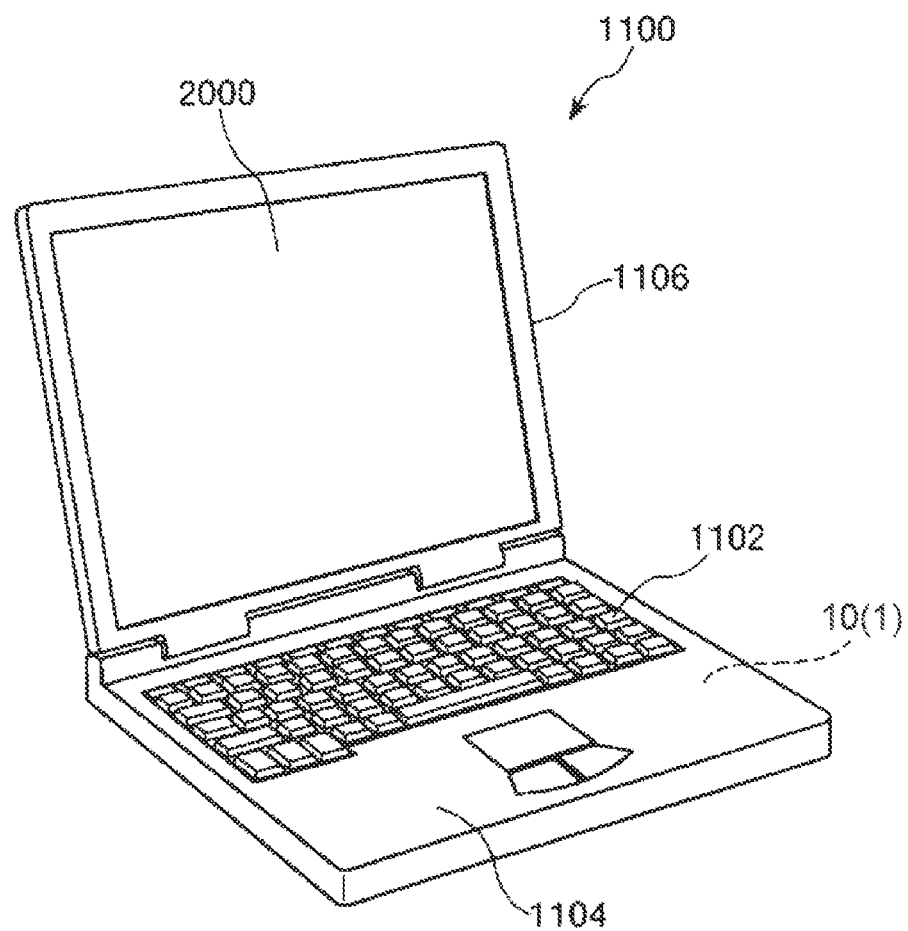
FIG. 19 is a perspective view illustrating a configuration of a mobile (or notebook) personal computer to which an electronic apparatus according to the invention is applied.

FIG. 19 is a perspective view illustrating a configuration of a mobile type (or a notebook type) personal computer to which the electronic apparatus according to the invention is applied. In the drawing, a personal computer 1100 is configured with a body section 1104 including a keyboard 1102 and a display unit 1106 including a display section 2000. The display unit 1106 is rotatably supported on the body section 1104 through a hinge structure. The resonator 10 (the resonator element 1) which serves as a filter, an oscillator, a reference clock or the like is built into the personal computer 1100.

Figure 20:
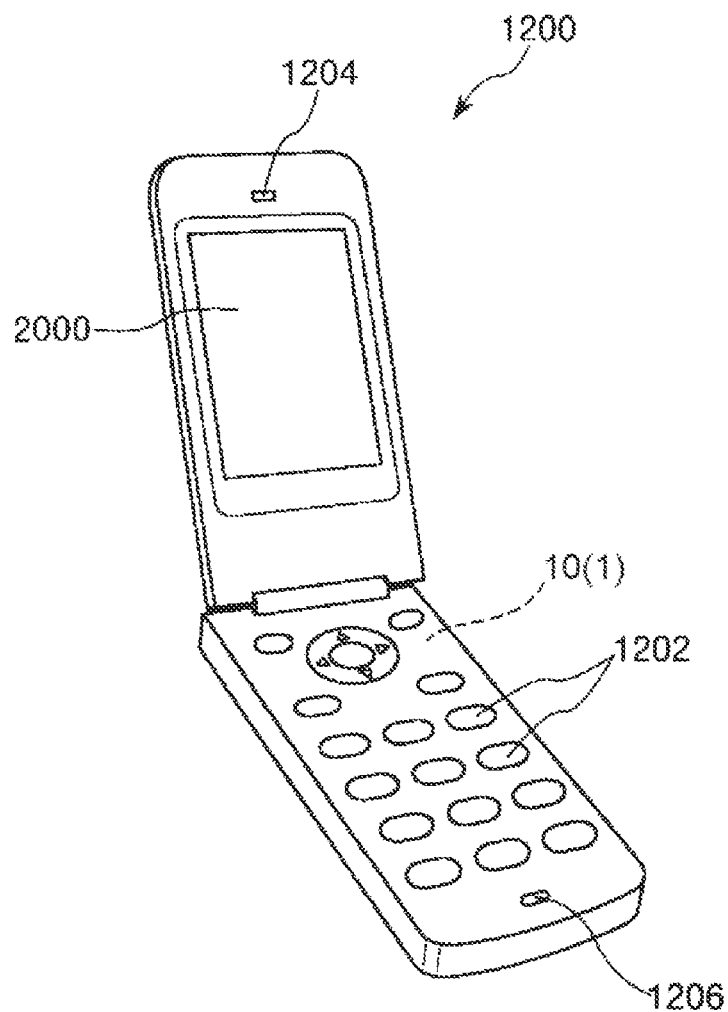
FIG. 20 is a perspective view illustrating a configuration of a cellular phone (also including a PHS) to which the electronic apparatus according to the invention is applied.

FIG. 20 is a perspective view illustrating a configuration of a cellular phone (also including PHS) to which the electronic apparatus according to the invention is applied. In the drawing, a cellular phone 1200 includes a plurality of operation buttons 1202, an ear piece 1204 and a mouth piece 1206, and a display section 2000 is disposed between the operation buttons 1202 and the ear piece 1204. The resonator (the resonator element 1) which serves as a filter, an oscillator, or the like is built into the cellular phone 1200.

Figure 21:
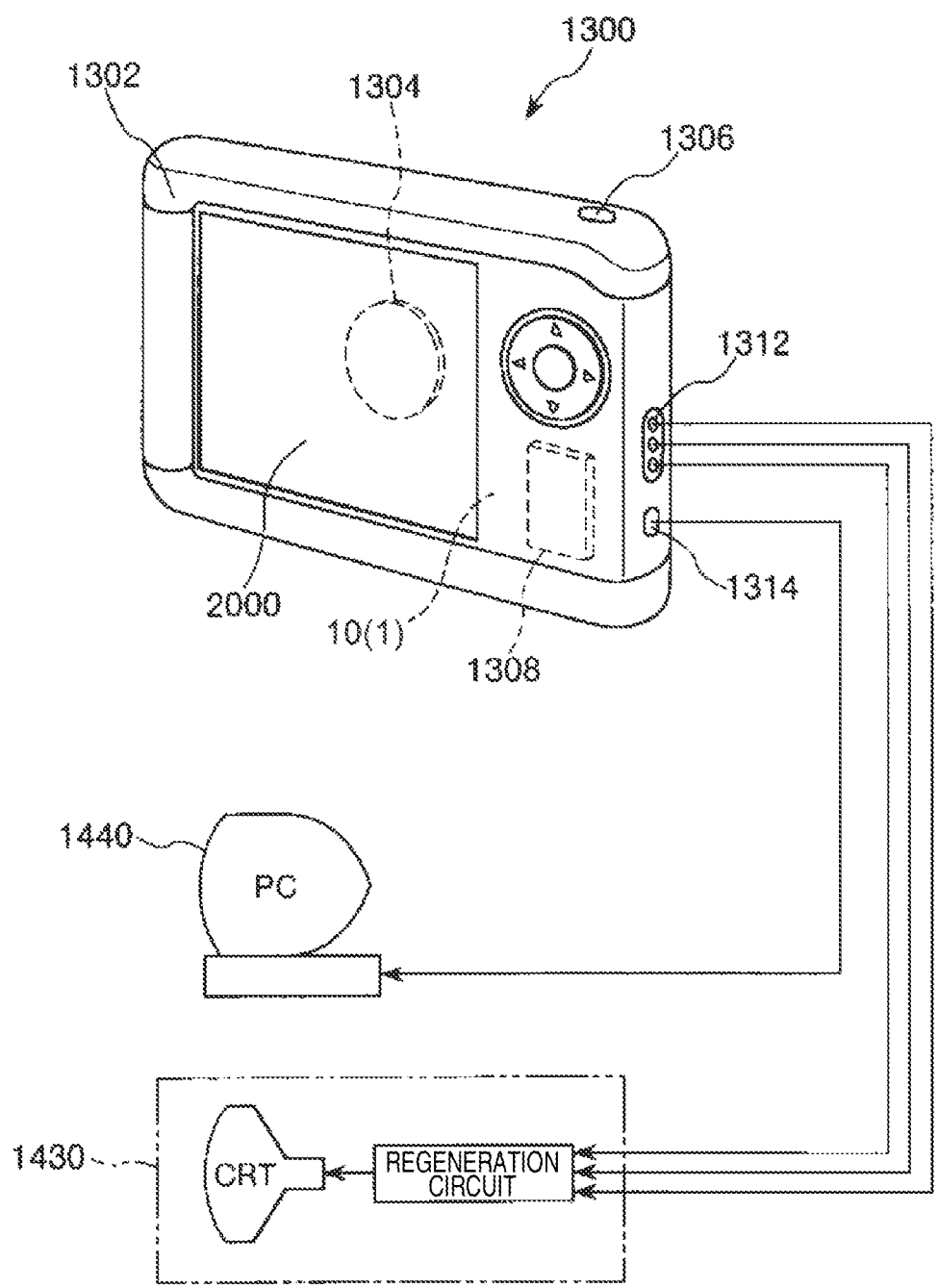
FIG. 21 is a perspective view illustrating a configuration of a digital still camera to which the electronic apparatus according to the invention is applied.

FIG. 21 is a perspective view illustrating a configuration of a digital still camera to which the electronic apparatus according to the invention is applied. In addition, in the drawing, connection to external apparatuses is briefly illustrated. Herein, in a normal camera, a silver salt photographic film is photosensitive to an optical image of a photographic subject while a digital still camera 1300 generates an imaging signal (image signal) through photoelectric conversion of the optical image of the photographic subject by an imaging device such as CCD (Charge Coupled Device) or the like.

The digital still camera 1300 is configured such that a display section is provided on a back surface of a case (body) 1302 and the display is performed by the CCD based on the imaging signal. The display section serves as a finder displaying the photographic subject as an electronic image. In addition, a light receiving unit 1304 including an optical lens (an imaging optical system), the CCD or the like is provided on the front side (the rear side in the drawing) of the case 1302.

When a photographer checks an image of the photographic subject displayed on the display section and presses a shutter button 1306, the imaging signal of the CCD at that time is transmitted and stored in a memory 1308. In addition, in the digital still camera 1300, a video signal output terminal 1312 and a data communication input-output terminal 1314 are provided on a side surface of the case 1302. Then, as illustrated in the drawing, the video signal output terminal 1312 is connected to a television monitor 1430 and the data communication input-output terminal 1314 is connected to a personal computer 1440, respectively if necessary. Furthermore, the digital still camera is configured such that the imaging signal stored in the memory 1308 is output to the television monitor 1430 or the personal computer 1440 with a predetermined operation. The resonator 10 (the resonator element 1) which serves as a filter, an oscillator, or the like is built into the digital still camera 1300.

In addition, the electronic apparatus including the resonator element according to the invention can be applied to, for example, an ink jet type ejecting apparatus (for example, an ink jet printer), a laptop personal computer, a television, a video camera, a video tape recorder, a car navigation apparatus, a pager, an electronic diary (also including communication function), an electronic dictionary, an electronic calculator, an electronic game apparatus, a word processor, a workstation, a television telephone, a security television monitor, electronic binoculars, a POS terminal, a medical apparatus (for example, an electronic thermometer, a blood pressure monitor, a blood glucose meter, an electrocardiogram measuring apparatus, an ultrasonic diagnostic apparatus and an electronic endoscope), a fish finder, various measuring apparatuses, measurement equipment (for example, measurement equipment for a vehicle, an aircraft and a ship), a flight simulator or the like, in addition to the personal computer (the mobile type personal computer) in FIG. 19, the cellular phone in FIG. 20 and the digital still camera in FIG. 21.

5. Moving Object

Next, the moving object (the moving object according to the invention) to which the resonator according to the invention is applied is described.

Figure 22:
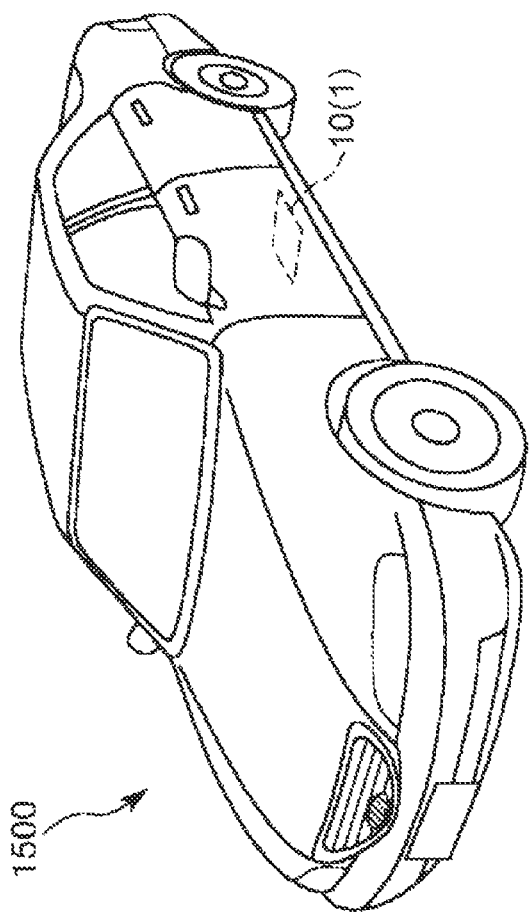
FIG. 22 is a perspective view schematically illustrating a vehicle as an example of a moving object according to the invention.

FIG. 22 is a perspective view schematically illustrating a vehicle as an example of the moving object according to the invention. The resonator 10 (the resonator element 1) is built into a vehicle 1500. The resonator 10 can be widely applied to an electronic control unit (ECU) such as in keyless entry, an immobilizer, a car navigation system, car air conditioning, an anti-lock braking system (ABS), an airbag, a tire pressure monitoring system (TPMS), an engine controller, a battery monitor of a hybrid vehicle or an electric vehicle, a vehicle body attitude control system or the like.

The resonator element, the resonator, the oscillator, the electronic apparatus and the moving object according to the invention are described above, based on the embodiments illustrated in the drawings but the invention is not limited to the embodiments and the configuration of each section can be replaced with any configuration having similar functions. In addition, other arbitrary configurations may be added to the invention. In addition, the embodiments described above may be appropriately combined with each other.

In the embodiments described above, the quartz crystal substrate is used as the piezoelectric substrate but, in place of this, for example, various piezoelectric substrates such as lithium niobate and lithium tantalite may be used.

Here, in the resonator element, generally, the size of the excitation electrode 31 decreases as the oscillation frequency becomes higher. In addition, the size of the vibration section 21 also decreases as the size of the excitation electrode 31 decreases.

Figure 23:
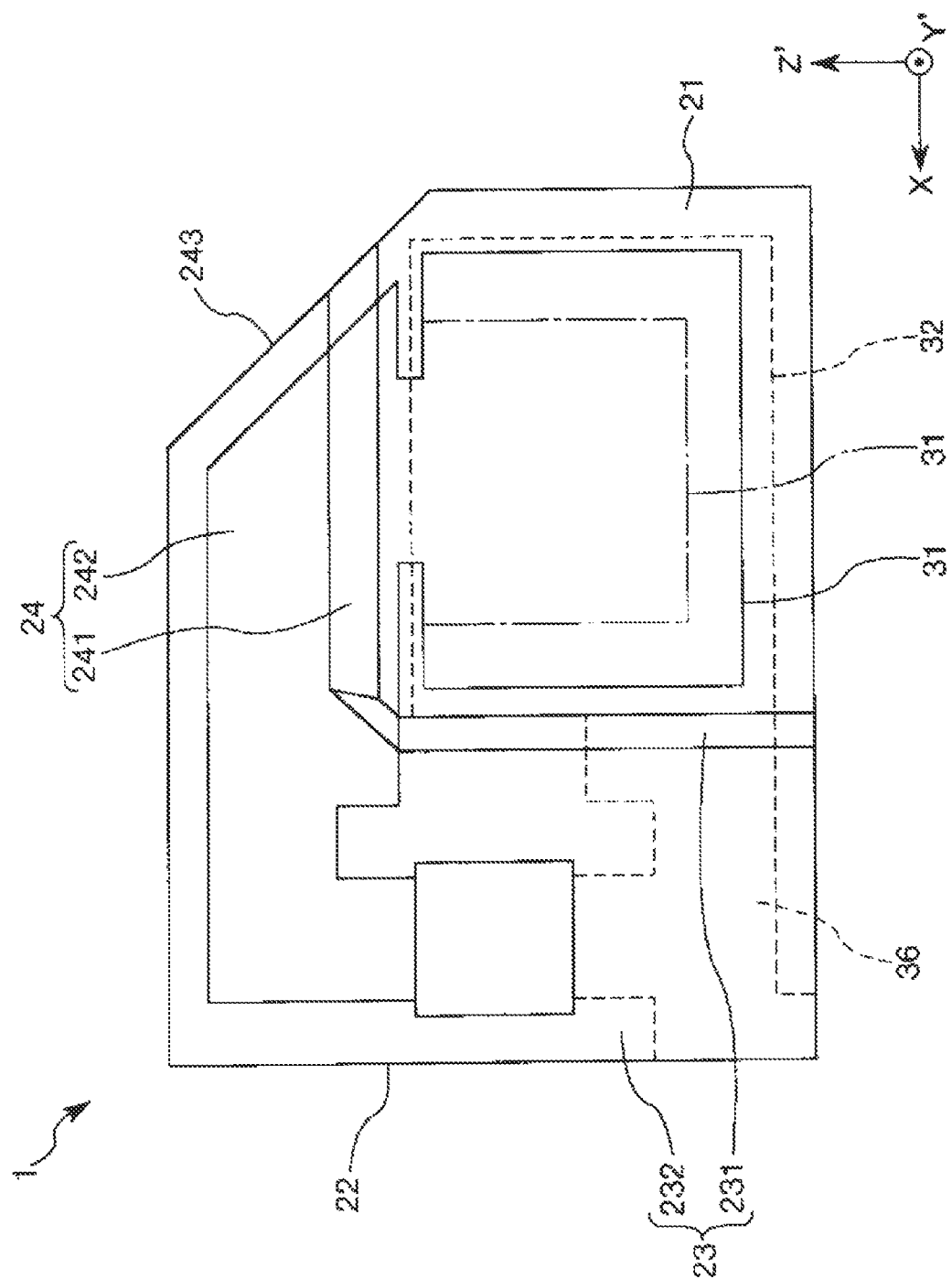
FIG. 23 is a plan view illustrating a relationship between the resonator element according to the invention and an oscillation frequency.

For example, if the oscillation frequency is approximately 100 MHz to 150 MHz, the configuration of the first embodiment in which the large vibration section 21 is secured is suitable. Therefore, it is possible to form the large excitation electrode 31. In addition, as illustrated in FIG. 23, in the first embodiment described above, it is possible to appropriately set the oscillation frequency between 100 MHz and 150 MHz by changing the size of the excitation electrode 31. 100 MHz is indicated by a solid line and 150 MHz is indicated by a one-dot chain line in FIG. 23.

Figure 24:
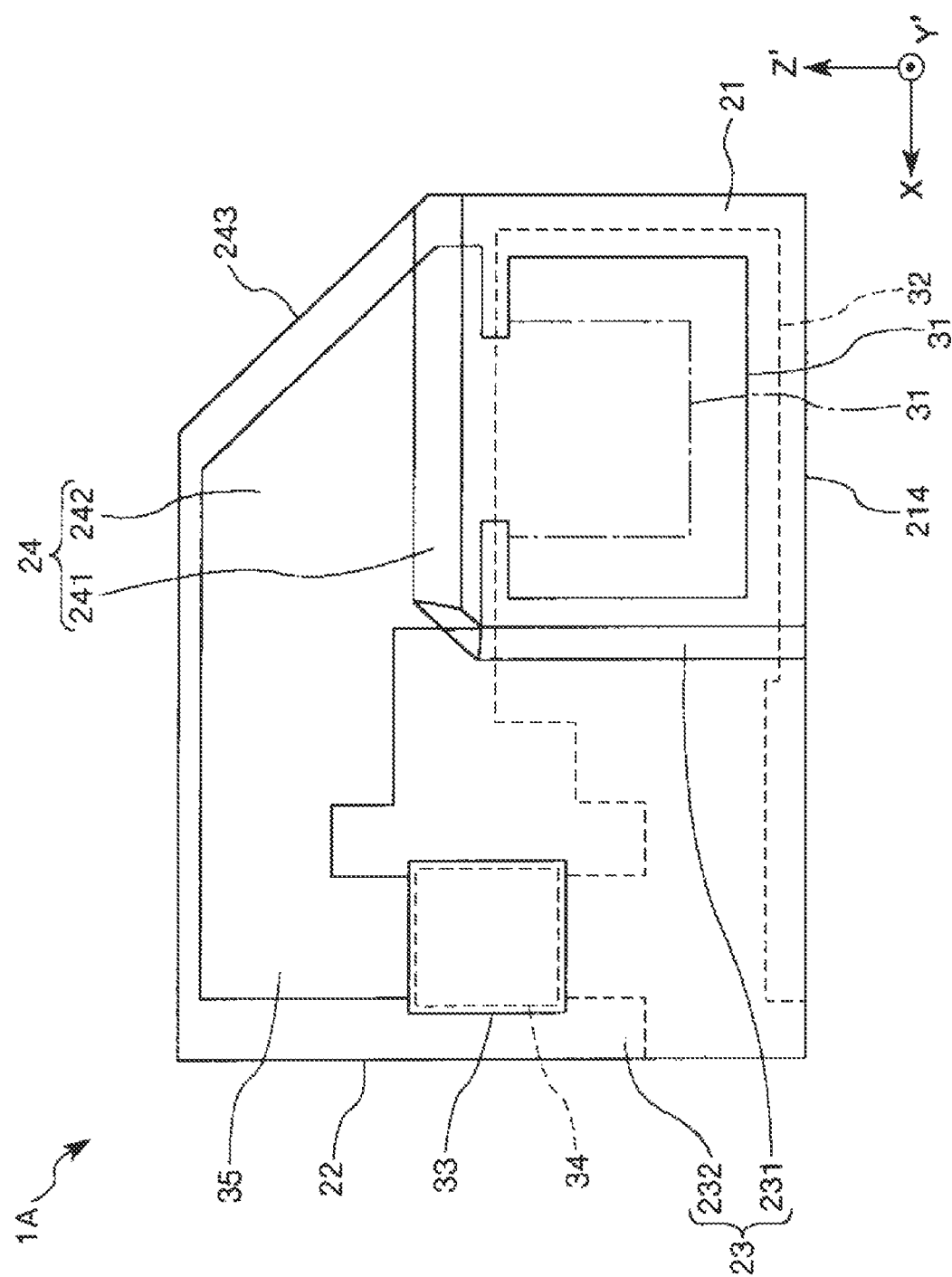
FIG. 24 is a plan view illustrating a relationship between the resonator element according to the invention and the oscillation frequency.

In addition, for example, if the oscillation frequency is approximately 150 MHz to 245 MHz, the configuration of the second embodiment in which the relatively large vibration section 21 is secured is suitable. Therefore, it is possible to form the relatively large excitation electrode 31. In addition, as illustrated in FIG. 24, in the second embodiment described above, it is possible to appropriately set the oscillation frequency between 150 MHz and 245 MHz by changing the size of the excitation electrode 31. 153 MHz is indicated by a solid line and 254 MHz is indicated by a one-dot chain line in FIG. 24.

Figure 25:
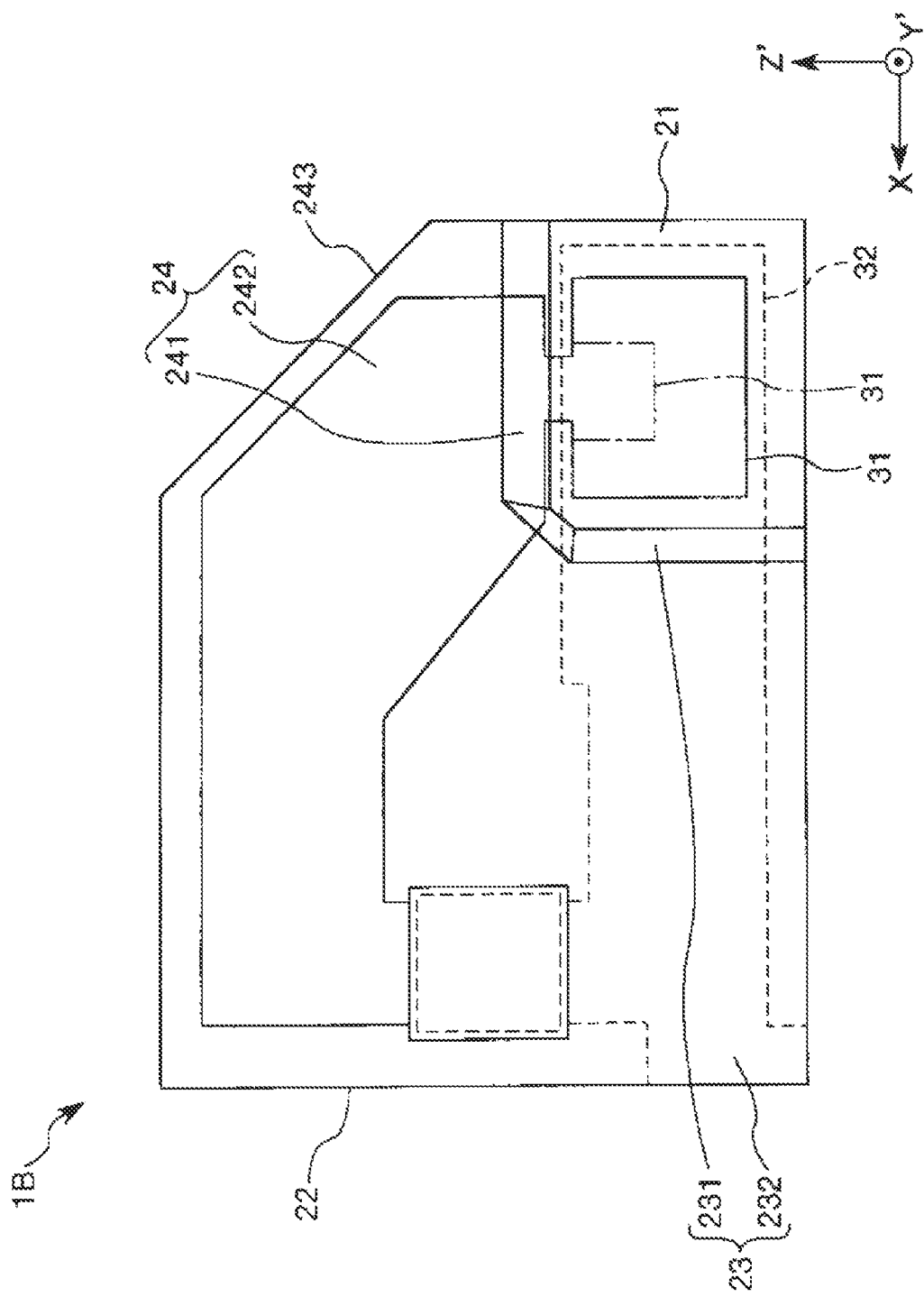
FIG. 25 is a plan view illustrating a relationship between the resonator element according to the invention and the oscillation frequency.

In addition, for example, if the oscillation frequency is approximately 245 MHz to 500 MHz, since the excitation electrode 31 may be small, the configuration of the third embodiment described above in which the vibration section 21 is small is suitable. In addition, as illustrated in FIG. 25, in the third embodiment described above, it is possible to appropriately set the oscillation frequency between 245 MHz and 500 MHz by changing the size of the excitation electrode 31. 245 MHz is indicated by a solid line and 500 MHz is indicated by a one-dot chain line in FIG. 25.

The entire disclosure of Japanese Patent Application No. 2013-007912, filed Jan. 18, 2013 is expressly incorporated by reference herein.

What is claimed is:

1. A resonator element comprising:
a quartz crystal substrate in which an X axis is set as a rotation axis, an axis inclined from a Z axis by rotating a plus Z side in a minus Y direction of a Y axis is set as a Z' axis, an axis inclined from the Y axis by rotating a plus Y side in a plus Z direction of the Z axis is set as a Y' axis, a surface including the X axis and the Z' axis is set as a main surface, and a direction along the Y' axis is set as a thickness thereof in the X axis as an electric axis, the Y axis as a mechanical axis, and the Z axis as an optical axis that are crystal axes of the quartz crystal,
wherein the quartz crystal substrate includes a first region and a second region integral with the first region, the first region having a vibration section which vibrates in thickness-shear vibration, the second region being thicker than the first region; and
excitation electrodes that are provided so as to sandwich the vibration section therebetween,
wherein the first region includes:
a pair of first outer edges that are along the Z' axis direction; and
a pair of second outer edges that are along in the X axis direction, wherein the second region includes:
a first thick section being provided along one of the pair of first outer edges, and the first thick section includes a fixing section to which an object is attachable; and
a second thick section being provided along one of the pair of second outer edges, and the second thick section extends from the first thick section, the second region is not provided in other of the pair of first outer edges and other of the pair of second outer edges,
the second thick section includes:
an outer edge section that is inclined with respect to the X axis direction and Z' axis direction in a plan view, the outer edge section being at an end of the second thick section that is opposite to the fixing section in a plan view.

2. The resonator element according to claim 1, wherein the second thick section includes:

an inclination section that extends from the at least one second outer edge and has a thickness that gradually increases away from the at least one second outer edge; and a thick section body having a constant thickness, the thick section body extending from an edge of the inclination section opposite to the at least one second outer edge in a plan view, and wherein an entirety of the outer edge section is provided along the thick section body.

3. The resonator element according to claim 1, wherein the second thick section includes:

an inclination section that extends from the at least one second outer edge and has a thickness that gradually increases away from the at least one second outer edge; and a thick section body having a constant thickness, the thick section body extending from an edge of the inclination section opposite to the at least one second outer edge in a plan view, and wherein the outer edge section only extends across the thick section body and the inclination section.

4. The resonator element according to claim 1, wherein the second thick section includes:

an inclination section that extends from the at least one second outer edge and has a thickness that gradually increases away from the at least one second outer edge; and a thick section body having a constant thickness, the thick section body extending from an edge of the inclination section opposite to the at least one second outer edge in a plan view, and wherein the outer edge section extends across the thick section body, the inclination section and the first region.

5. The resonator element according to claim 1, wherein in the X axis direction of the second thick section, when a first thick region is aligned with the excitation electrodes, and when a second thick region is opposite to the fixing section from the first thick region in a plan view, the outer edge section only extends across the first thick region and the second thick region.

6. The resonator element according to claim 1, wherein in the X axis direction of the second thick section, when a first thick region is aligned with the excitation electrode, when a second thick region is opposite to the fixing section from the first thick region, and when a third thick region is on a side of the fixing section from the first thick region, the outer edge section extends across the first thick region, the second thick region and the third thick region.

7. The resonator element according to claim 2, wherein in a plan view, when an S1 region has an area S1, and the S1 region is surrounded by:

an edge of the thick section body of the second thick section on a side of the second outer edge;

an edge opposite to the second outer edge of the thick section body;

a straight line intersecting with one end of one of the excitation electrodes in the X axis direction and orthogonal to the X axis direction; and a straight line intersecting with the other end of the one of the excitation electrode in the X axis direction and orthogonal to the X axis direction, and an area of the second thick section in the S1 region is S2, a relationship of $0.65 \leq S2/S1 \leq 0.85$ is satisfied.

8. The resonator element according to claim 2, wherein in a plan view, when an S3 region has an area S3, and the S3 region is surrounded by:

an edge of the thick section body of the second thick section on a side of the second outer edge;

an edge opposite to the second outer edge of the thick section body;

a straight line intersecting with one end of the first region in the X axis direction and orthogonal to the X axis direction; and a straight line intersecting with an other end of the first region in the X axis direction and orthogonal to the X axis direction, and an area of the second thick section in the S3 region is S4, a relationship of $S4/S3 \leq 0.75$ is satisfied.

9. The resonator element according to claim 1, wherein an area of the first region is ½ or less of an area of the quartz crystal substrate in a plan view.

10. The resonator element according to claim 1, wherein the first outer edge extending from the first thick section and the second outer edge extending from the second thick section are connected to each other by a third outer edge intersecting the X axis direction and the Z' axis direction.

11. The resonator element according to claim 10, further comprising:

an extraction electrode that extends from one of the excitation electrodes to a main surface of the second region through a first side wall which is connected to the second outer edge of the second region and a second side wall which is connected to the third outer edge.

12. The resonator element according to claim 1, wherein a background near the fixing section is visually recognizable through a region between the fixing section and one of the excitation electrodes in a plan view.

13. A resonator comprising:
the resonator element according to claim 1; and
a package that stores the resonator element.

14. An oscillator comprising:
the resonator element according to claim 1; and
a circuit.

15. An electronic apparatus comprising:
the resonator element according to claim 1.

16. A moving object comprising:
the resonator element according to claim 1.

* * * * *